US012805349B2

(12) United States Patent
Satake et al.

(10) Patent No.: US 12,805,349 B2
(45) Date of Patent: Nov. 17, 2026

(54) COMPOSITE COMPONENT

(71) Applicant: Murata Manufacturing Co., Ltd., Kyoto-fu (JP)

(72) Inventors: Yoshiaki Satake, Nagaokakyo (JP); Tatsuya Funaki, Nagaokakyo (JP); Kei Arai, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 405 days.

(21) Appl. No.: 18/399,324

(22) Filed: Dec. 28, 2023

(65) Prior Publication Data

US 2024/0136268 A1 Apr. 25, 2024

Related U.S. Application Data

(63) Continuation of application No. PCT/JP2023/002631, filed on Jan. 27, 2023.

(30) Foreign Application Priority Data

Feb. 9, 2022 (JP) ................................ 2022-018785

(51) Int. Cl.
*H10W 70/60* (2026.01)
*H10W 70/63* (2026.01)
(Continued)

(52) U.S. Cl.
CPC ......... *H10W 70/635* (2026.01); *H10W 70/68* (2026.01); *H10W 74/117* (2026.01);
(Continued)

(58) Field of Classification Search
CPC ............... H10W 74/10; H10W 74/014; H10W 72/0198; H10W 70/60
See application file for complete search history.

(56) References Cited

U.S. PATENT DOCUMENTS

2011/0193228 A1 8/2011 Yu et al.
2014/0131858 A1* 5/2014 Pan .................... H10W 70/093 257/737

(Continued)

FOREIGN PATENT DOCUMENTS

JP 2012-227444 A 11/2012
JP 2016-072332 A 5/2016
JP 2017-017238 A 1/2017

OTHER PUBLICATIONS

International Search Report issued in PCT/JP2023/002631; mailed Mar. 20, 2023.

*Primary Examiner* — Marlon T Fletcher
*Assistant Examiner* — Samuel Jonathan Smith
(74) *Attorney, Agent, or Firm* — Studebaker Brackett PLLC

(57) ABSTRACT

A composite component includes an Si base layer that has first and second main surfaces that are opposite to each other, a rerouting layer on the first main surface, a through-silicon via that is electrically connected to the rerouting layer, and that extends through the Si base layer, and an electronic component layer on the second main surface of the Si base layer, and that includes electronic components each including an electronic component body and a component electrode on the electronic component body. The component electrode is connected to the through-silicon via. One or more of the electronic components have a curved shape that is curved to protrude in a mount direction in a cross-sectional view. A mount surface of the composite component corresponds to the curved shape in a cross-sectional view, and includes one or more first curved surfaces that are curved to protrude in the mount direction.

21 Claims, 16 Drawing Sheets

(51) Int. Cl.

| | |
|---|---|
| ***H10W 70/68*** | (2026.01) |
| ***H10W 72/00*** | (2026.01) |
| ***H10W 74/01*** | (2026.01) |
| ***H10W 74/10*** | (2026.01) |
| *H10W 70/09* | (2026.01) |
| *H10W 72/30* | (2026.01) |
| *H10W 90/00* | (2026.01) |

(52) U.S. Cl.

CPC ............ *H10W 70/09* (2026.01); *H10W 70/60* (2026.01); *H10W 72/0198* (2026.01); *H10W 72/073* (2026.01); *H10W 72/07332* (2026.01); *H10W 72/07338* (2026.01); *H10W 72/354* (2026.01); *H10W 74/014* (2026.01); *H10W 90/00* (2026.01); *H10W 90/734* (2026.01)

(56) References Cited

U.S. PATENT DOCUMENTS

| | | | | |
|---|---|---|---|---|
| 2016/0379921 | A1 | 12/2016 | Shin et al. | |
| 2019/0355692 | A1* | 11/2019 | Yeh ........................ | H10P 52/402 |
| 2020/0381391 | A1 | 12/2020 | Yu et al. | |
| 2023/0065941 | A1* | 3/2023 | Tsai ........................ | H10P 72/74 |

* cited by examiner

COMPOSITE COMPONENT

CROSS-REFERENCE TO RELATED APPLICATIONS

This application claims benefit of priority to International Patent Application No. PCT/JP2023/002631, filed Jan. 27, 2023, and to Japanese Patent Application No. 2022-018785, filed Feb. 9, 2022, the entire contents of each are incorporated herein by reference.

BACKGROUND

Technical Field

The present disclosure relates to a composite component.

Background Art

As an example of an existing composite component including an electronic component mounted on a circuit board, a semiconductor device is described in FIG. 1 in Japanese Unexamined Patent Application Publication No. 2017-17238. This semiconductor device includes an insulating material layer on one side. The insulating material layer receives an outer electrode thereon. A surface of the insulating material layer opposite to a mount surface receiving the outer electrode receives a semiconductor element mounted thereon with an adhesive interposed therebetween while having a device circuit surface and an electrode on the device circuit surface facing up. The semiconductor element and its surroundings are sealed with a second insulating material layer. To accompany the first insulating material layer and the second insulating material layer, metal thin film wiring layers formed from copper or a copper alloy are disposed. Metal vias electrically connect any wiring layers of the metal thin film wiring layers together, and electrically connect the metal thin film wiring layers to each of the electrode of semiconductor element together.

SUMMARY

The above composite component has been found to have the following issue. Specifically, when the composite component is mounted on a circuit board, voids are formed in an underfill layer. Thus, the circuit board on which the composite component is mounted may reduce electric connectivity.

To address this, the present disclosure aims to provide a composite component that restricts the reduction in electric connectivity and improves the reliability of an electronic device including the composite component.

The inventors have studied the above issues, and found that a coating film (an uncured underfill layer) formed from an underfill member used to mount a composite component on a circuit board can serve as a path along which voids move. Based on this technical finding, the shape of a mount surface receiving the composite component corresponding to the shape of the upper surface of the coating film is adjusted to control the shape of the coating film that can serve as a path along which voids move and to allow the voids to move out of the mount surface receiving the composite component. Thus, the present disclosure that improves the reliability of an electronic device including a composite component is conceived.

More specifically, the present disclosure includes embodiments below.

A composite component according to an aspect of the present disclosure includes an Si base layer that has a first main surface and a second main surface that are opposite to each other, a rerouting layer that is disposed on the first main surface, a through-silicon via that is electrically connected to the rerouting layer, and that extends through the Si base layer, and an electronic component layer that is disposed on the second main surface of the Si base layer, and that includes a plurality of electronic components each including an electronic component body and a component electrode disposed on the electronic component body. The component electrode is connected to the through-silicon via, and wherein one or more of the plurality of electronic components have a curved shape that is curved to protrude in a mount direction in a cross-sectional view, a mount surface of the composite component corresponds to the curved shape in a cross-sectional view, and includes one or more first curved surfaces that are curved to protrude in the mount direction.

In the present embodiment, the mount surface of the composite component includes one or more first curved surfaces that correspond to the curved shape of one or more electronic components in a cross-sectional view and that are curved to protrude in the mount direction. Thus, in the package structure of the composite component, the upper surface of the underfill layer is in contact with the mount surface of the composite component including a curved surface that is curved to protrude vertically downward. When the composite component is to be mounted on the circuit board, the uncured underfill layer (the coating film formed from the underfill member) has a variance in thickness, and thus allows the voids therein to move out of the mount surface of the composite component. Thus, the uncured underfill layer allows the voids therein to more easily move out of the mount surface of the composite component in a plan view. Thus, the composite component according to the present embodiment restricts the reduction in electric connectivity.

A composite component according to an aspect includes an interposer structure including the Si base layer, the rerouting layer, the through-silicon via, and an interposer electrode that faces the second main surface, wherein the electronic component layer is disposed between the interposer electrode and the Si base layer.

The present embodiment including the interposer electrode can provide a composite component having an interposer structure that restricts the reduction in electric connectivity.

In an aspect of a composite component, the plurality of electronic components are bonded to the second main surface of the Si base layer with an adhesive layer, wherein, in a cross-sectional view, a region of the adhesive layer located between the one or more electronic components and the second main surface of the Si base layer has a smaller thickness at a center portion than at an end portion.

In the present embodiment, in a cross-sectional view, the thickness of the adhesive layer located closer to the mount surface receiving the one or more electronic components is smaller at the center portion than at the end portions. Thus, the uncured adhesive layer (that is, an adhesive coating film) that can serve as a path along which the voids move during the manufacture of the composite component has a greater thickness at the end portions than at the center portion in a cross-sectional view. Thus, the uncured adhesive layer allows the voids therein to easily move out of the uncured mount surface receiving the electronic component. Thus, the composite component according to the present embodiment further restricts the reduction in electric connectivity.

In an aspect of a composite component, in a cross-sectional view, the center portion has a thickness smaller than or equal to 10 μm.

In the present embodiment, in a cross-sectional view, the thickness of the adhesive layer located closer to the mount surface receiving the one or more electronic components is smaller than or equal to 10 μm at the center portion. In this case, the length of the through-silicon via in a lamination direction (an electric connection path) is reduced, and thus, the direct current resistance Rdc and the thermal resistance can be reduced.

In an aspect of a composite component, the one or more electronic components further include a resin layer disposed between the component electrodes.

In the present embodiment, the one or more electronic components further include a resin layer disposed between the component electrodes. The resin layer more easily expands, for example, with heat than the electronic component body of the electronic component. Thus, for example, the one or more electronic components are more likely to have a curved shape that is curved to protrude toward the resin layer (in the mount direction) during the manufacture of the composite component.

In an aspect of a composite component, a coefficient of linear expansion of the resin layer is greater than a coefficient of linear expansion of the electronic component body.

In the present embodiment, the coefficient of linear expansion of the resin layer is greater than the coefficient of linear expansion of the electronic component body. For example, during the manufacture of the composite component, the resin layer of the one or more electronic components is disposed closer to the mount surface of the composite component than the electronic component body, and expands with heat further than the electronic component body. Thus, during the manufacture of the composite component, the one or more electronic components including the resin layer may have a shape that is curved to protrude in the mount direction. Thus, all the one or more electronic components in the composite component may have a curved shape that is curved to protrude in the mount direction of the composite component.

In an aspect of a composite component, the resin layer includes resin, and the electronic component body includes ceramic or a semiconducting material.

In the present embodiment, the resin layer includes resin, and the electronic component body includes silicon or a semiconductor material. For example, during the manufacture of the composite component, the resin layer of the one or more electronic components is disposed closer to the mount surface of the composite component than the electronic component body, and expands with heat further than the electronic component body. Thus, during the manufacture of the composite component, the one or more electronic components including the resin layer may have a curved shape that is curved to protrude in the mount direction. Thus, entireties of all the one or more electronic components in the composite component may have a curved shape that is curved to protrude in the mount direction of the composite component.

In an aspect of a composite component, the Si base layer has a thickness smaller than a thickness of the plurality of electronic components.

In the present embodiment, the thickness of the Si base layer is smaller than the thickness of the plurality of electronic components. Thus, the mount surface of the composite component can easily reflect the curved shape of the one or more electronic components.

In an aspect of a composite component, the electronic component layer further includes a resin seal portion that seals the plurality of electronic components, and an entirety of the composite component is curved to protrude in the mount direction.

In the present embodiment, the entirety of the composite component is curved to protrude in the mount direction. Thus, in the package structure of the composite component, the upper surface of the underfill layer is in contact with the mount surface of the composite component having a shape that is curved to protrude vertically downward with respect to the entirety of the mount surface of the circuit board. When the composite component is to be mounted on the circuit board, the uncured underfill layer (the coating film formed from the underfill member) has a variance in thickness, and allows the voids therein to more easily move out of the mount surface of the composite component. Thus, the uncured underfill layer allows the voids therein to more easily move out of the mount surface of the composite component in a plan view. Thus, the composite component according to the present embodiment further restricts the reduction in electric connectivity.

In an aspect of a composite component, the mount surface of the composite component includes the first curved surfaces in a cross-sectional view.

In the present embodiment, the mount surface of the composite component includes multiple first curved surfaces in a cross-sectional view. The proportion of the area of the first curved surfaces to the mount surface of the composite component increases. Thus, the underfill layer in the package structure in the composite component includes fewer voids. Thus, the composite component according to the present embodiment further restricts the reduction in electric connectivity.

In an aspect of a composite component, in a cross-sectional view, at least two of the first curved surfaces are adjacent to each other with a bend interposed therebetween.

In the present embodiment, in a cross-sectional view, at least two of the multiple first curved surfaces are adjacent to each other with a bend interposed therebetween. Thus, in the package structure of the composite component, the upper surface of the underfill layer is in contact with the mount surface of the composite component with the above shape. When the composite component is mounted on the circuit board, the uncured underfill layer has a variance in thickness, and also has a portion corresponding to the bend of the mount surface of the composite component. The portion corresponding to the bend can also serve as a path along which the voids move. Thus, the uncured underfill layer allows the voids therein to more easily move out of the mount surface of the composite component in a plan view. Thus, the composite component according to the present embodiment further restricts the reduction in electric connectivity.

In an aspect of a composite component, the one or more first curved surfaces in the mount surface of the composite component make up equal to or more than 70% of a total area of the mount surface in a plan view.

In the present embodiment, the first curved surfaces in the mount surface of the composite component make up equal to or more than 70% of the area of the entire mount surface in a plan view. Thus, the proportion of the area of the first curved surfaces to the mount surface of the composite component increases, and the underfill layer in the package structure in the composite component includes fewer voids.

Thus, the composite component according to the present embodiment further restricts the reduction in electric connectivity.

In an aspect of a composite component, the plurality of electronic components are disposed in the electronic component layer while the component electrodes are electrically connected to the rerouting layer with the through-silicon via linearly extending in a cross-sectional view interposed therebetween.

In the present embodiment where the multiple electronic components are disposed in the same directions in the electronic component, compared to the case where the multiple electronic components are disposed in different directions, the curves of the electronic components are less easily offset, and the entirety of the composite component is more easily curved to protrude in the mount direction. Thus, the composite component according to the present embodiment further restricts the reduction in electric connectivity.

The composite component according to an aspect of the present disclosure can restrict the reduction in electric connectivity and improve the reliability of an electronic device including a composite component.

DETAILED DESCRIPTION

Figure 1:
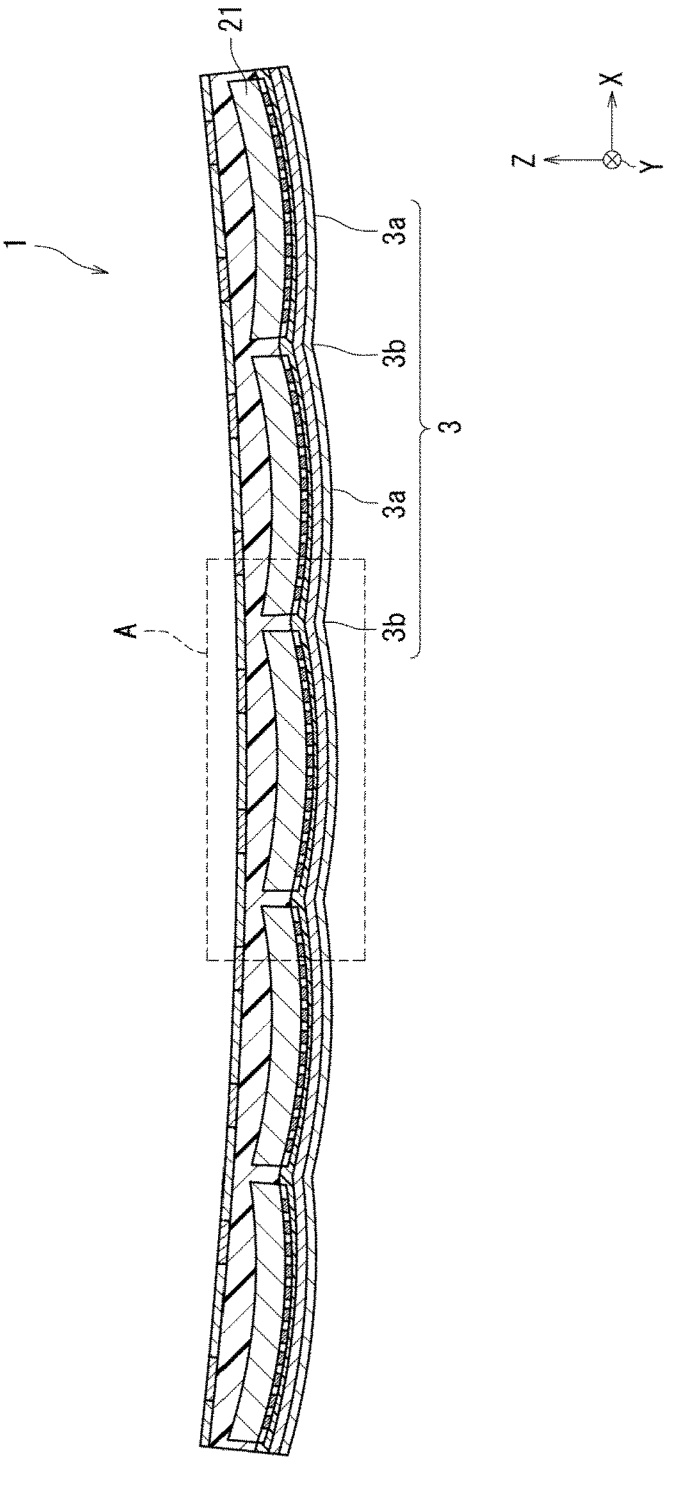
FIG. 1 is a cross-sectional view of a composite component according to a first embodiment.

A composite component and a package structure including the composite component according to one aspect of the present disclosure are described below in detail with reference to an embodiment illustrated in the drawings. Some of the drawings are schematic, or actual dimensions or ratio may fail to be reflected on some of the drawings. The dimensions (more specifically, dimensions including the thickness) of components in the composite component are measured based on a scanning electron microscope (SEM) image captured by a scanning electron microscope. The above dimensions are obtained from a mean value of multiple measurements (number of measurements $n \geq 3$).

Various types of numerical range described herein are intended to include the lower and upper limit numerical values (specifically, the upper limit and the lower limit) unless otherwise specified with the terms such as "less than", "greater than", and "smaller than". More specifically, when the numerical range of 1 to 30 μm is taken as an example, the numerical range 1 to 30 μm is construed as including the lower limit "1 μm", and the upper limit "30 μm".

First Embodiment: Composite Component

[Structure]

Figure 2:
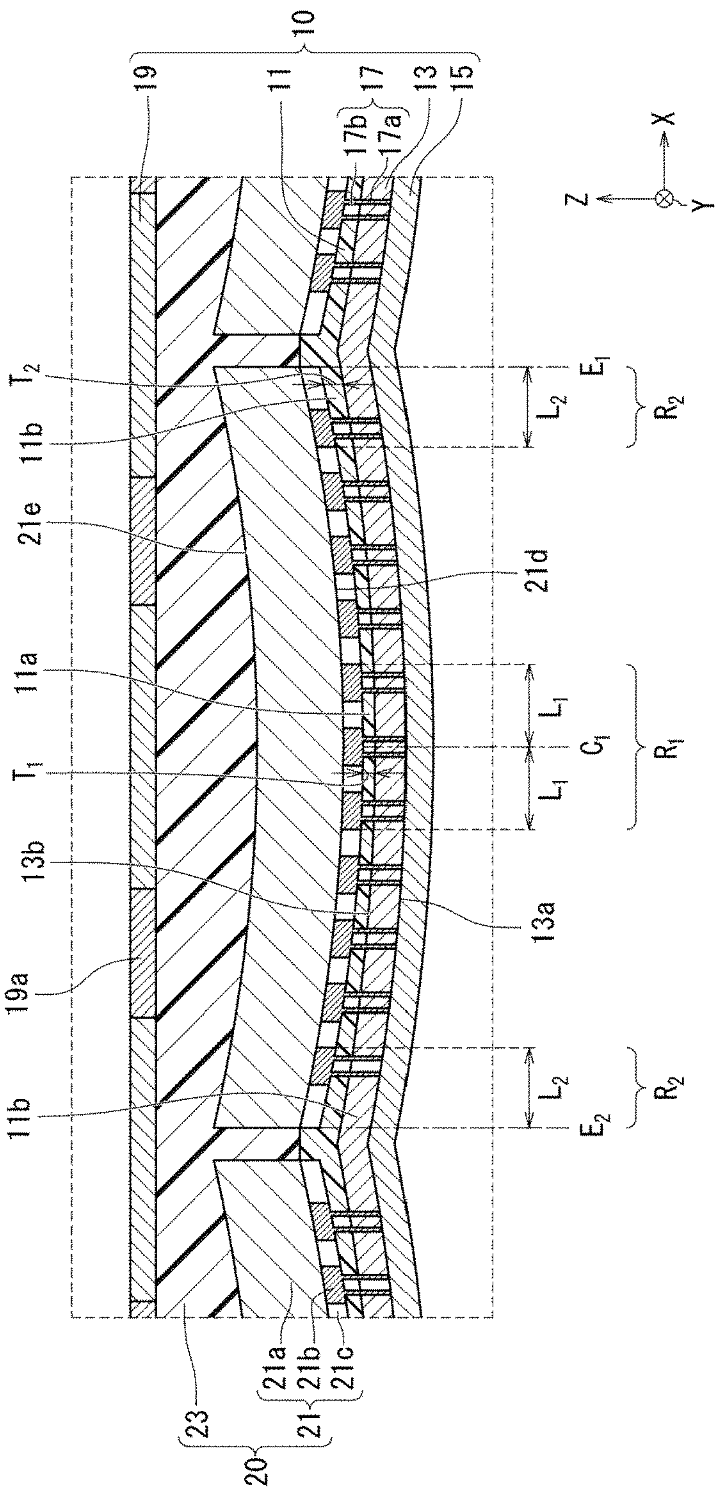
FIG. 2 is an enlarged view of a portion Ain FIG. 1.

FIG. 1 is a schematic cross-sectional view of a composite component 1 according to a first embodiment of the present disclosure. FIG. 2 is an enlarged view of a portion A in FIG. 1.

As illustrated in FIG. 1 and FIG. 2, the composite component 1 includes an interposer structure 10 and an electronic component layer 20. In the drawings, the direction parallel to the thickness of the composite component 1 is defined as a Z direction, a positive Z direction is defined as an upward direction, and a negative Z direction is defined as a downward direction. In the plane perpendicular to the Z direction of the composite component 1, the direction parallel to the plane of the drawings is defined as an X direction, and the direction perpendicular to the plane of the drawings is defined as an Y direction.

In the composite component 1 according to the present embodiment, the interposer structure 10 includes an Si base layer 13 that includes a first main surface 13*a* and a second main surface 13*b* that are opposite to each other, a rerouting layer 15 disposed on the first main surface 13*a*, through-silicon vias 17 that are electrically connected to the rerouting layer 15 and extend through the Si base layer 13, and interposer electrodes 19*a* that face the second main surface 13*b*. The interposer structure 10 also includes an adhesive layer 11 that receives multiple electronic components 21 bonded to the second main surface 13*b*. The electronic component layer 20 includes the multiple electronic components 21 that each include an electronic component body 21*a* and component electrodes 21*b* disposed on the electronic component body 21*a*. The electronic component layer 20 is disposed on the second main surface 13*b* of the Si base layer 13. The electronic component layer 20 is disposed between the interposer electrodes 19*a* and the Si base layer 13. The component electrodes 21*b* are connected to the through-silicon vias 17.

(Mount Surface)

Figure 7:
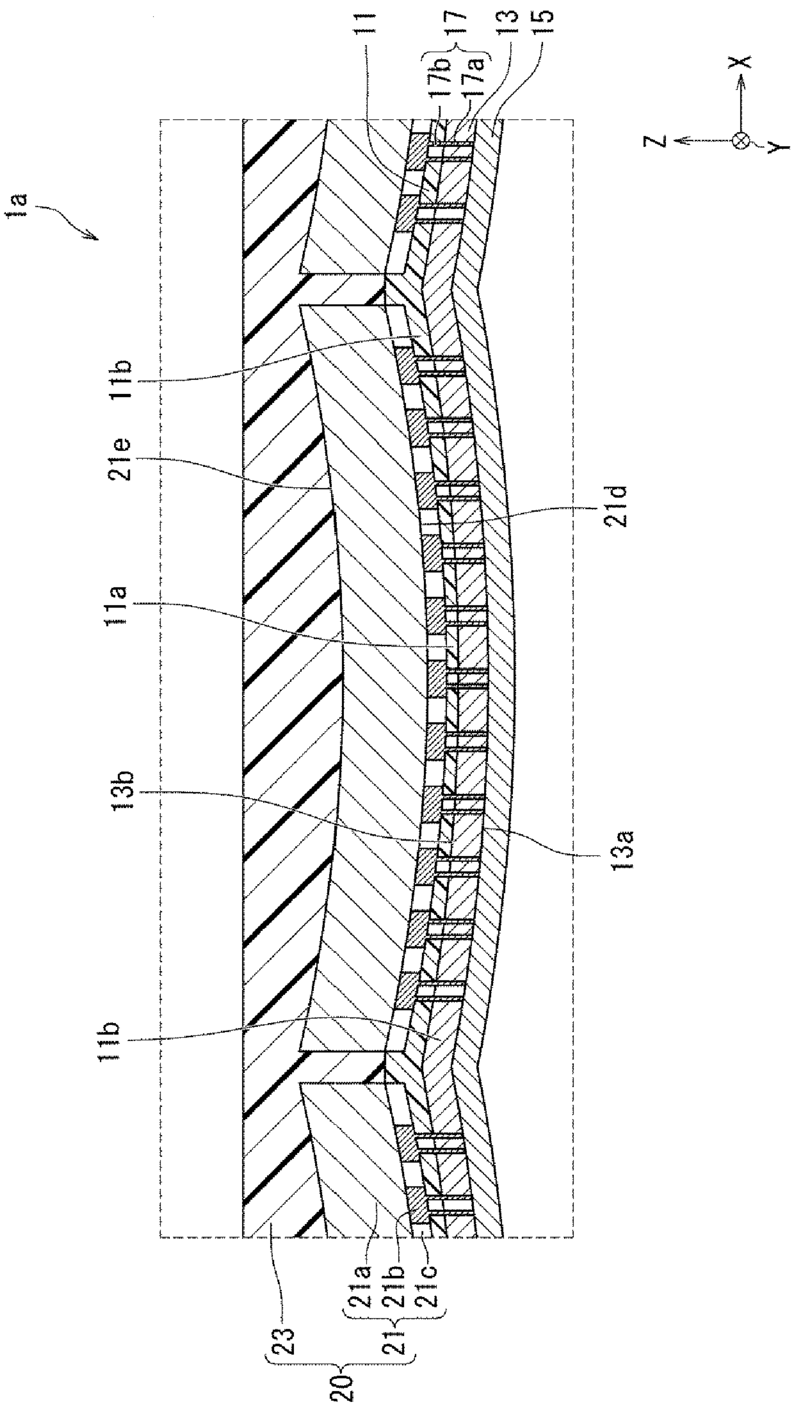
FIG. 7 is an enlarged cross-sectional view of a composite component according to a modification example formed by modifying the composite component according to the first embodiment.

In a cross-sectional view, one or more of the multiple electronic components 21 have a curved shape that is curved to protrude in a mount direction. In a cross-sectional view, a mount surface 3 of the composite component 1 includes one or more first curved surfaces 3_a_ that correspond to the curved shape of one or more electronic components 21 and that are curved to protrude in the mount direction. As illustrated in FIG. 1, the entirety of the composite component 1 is curved to protrude in the mount direction, but in FIG. 2, the entirety of the composite component 1 is illustrated as being planar for the purpose of convenience. FIG. 7 illustrates a modification example in a similar manner.

Herein, each first curved surface 3_a_ indicates, in a cross-sectional view (in a ZX cross-sectional view) of the composite component 1, a mount surface that extends vertically downward (in the negative Z direction) beyond a first straight line passing a point (a first intersection point) where an extension of a first end surface $E_1$ of the electronic component 21 crosses the mount surface 3 and a point (a second intersection point) where an extension of a second end surface $E_2$ of the electronic component 21 crosses the mount surface. The first curved surface 3_a_ is simply formed from a curved surface and entirely, continuously, and gently curved without being sharply bent in the middle.

Method for Checking Existence of First Curved Surface

Whether the mount surface 3 of the composite component 1 includes any first curved surface 3_a_ can be checked in the following manner. More specifically, the composite component 1 is cut to form a cross section (a ZX cross section) including a center portion (its definition is described below) of at least one electronic component (also referred to as a target electronic component below) 21 in the one or more electronic components 21. An SEM image of the ZX cross section is captured. A first straight line that passes the first intersection point and the second intersection point of the target electronic component 21 in the SEM image is formed. Whether any region of the mount surface 3 extends vertically downward (a negative Z direction) beyond the first straight line is checked. When any region of the mount surface 3 extends vertically downward, and the curved surface can be fitted to the mount surface 3 extending vertically downward, the mount surface 3 of the composite component 1 is determined to have the first curved surface 3_a_ in a direction vertically downward (in the negative Z direction) from the target electronic component 21. When multiple electronic components 21 are included, the existence of the first curved surfaces 3_a_ corresponding to the respective electronic components 21 can be determined.

Figure 4:
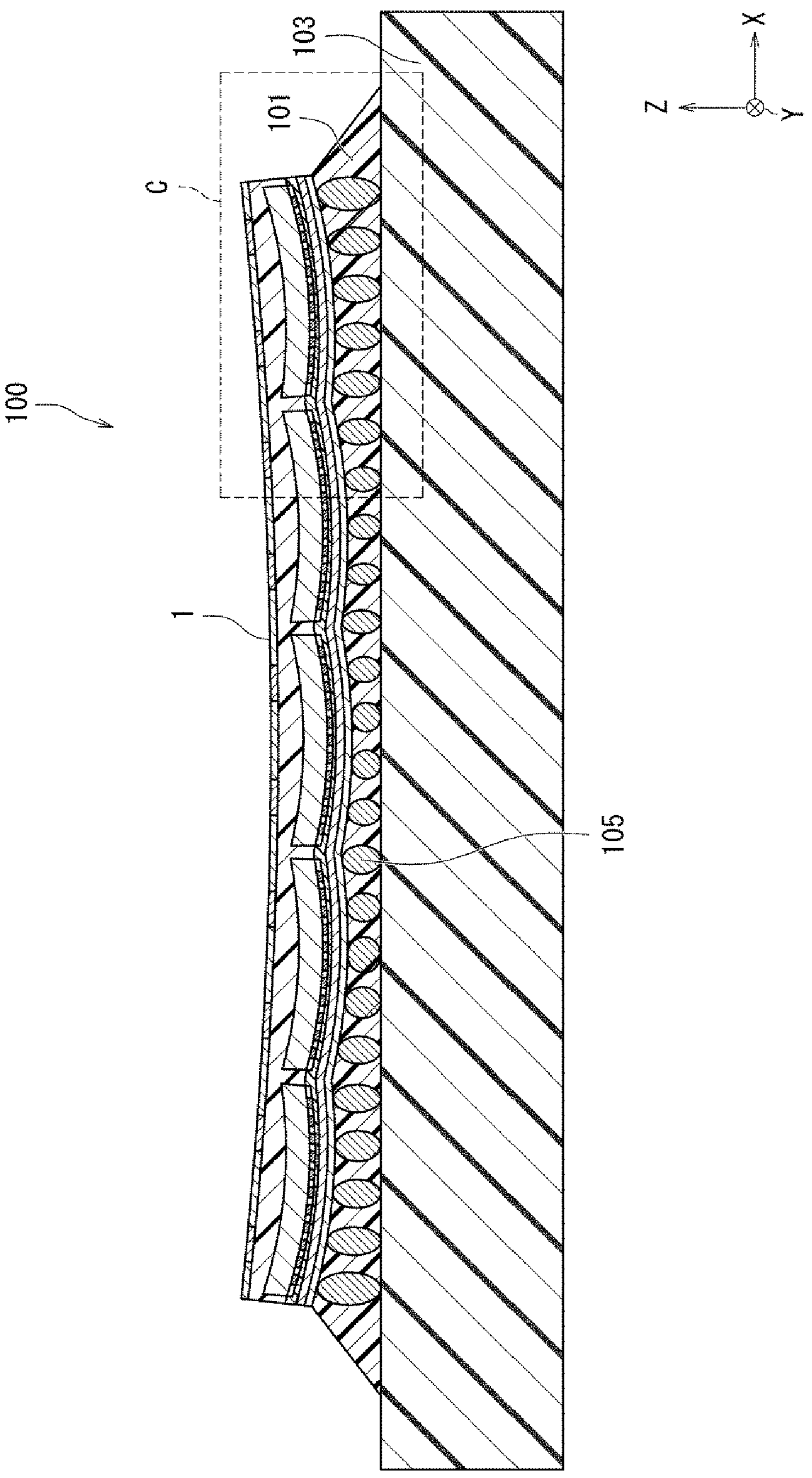
FIG. 4 is a cross-sectional view of a package structure according to a second embodiment.
Figure 5:
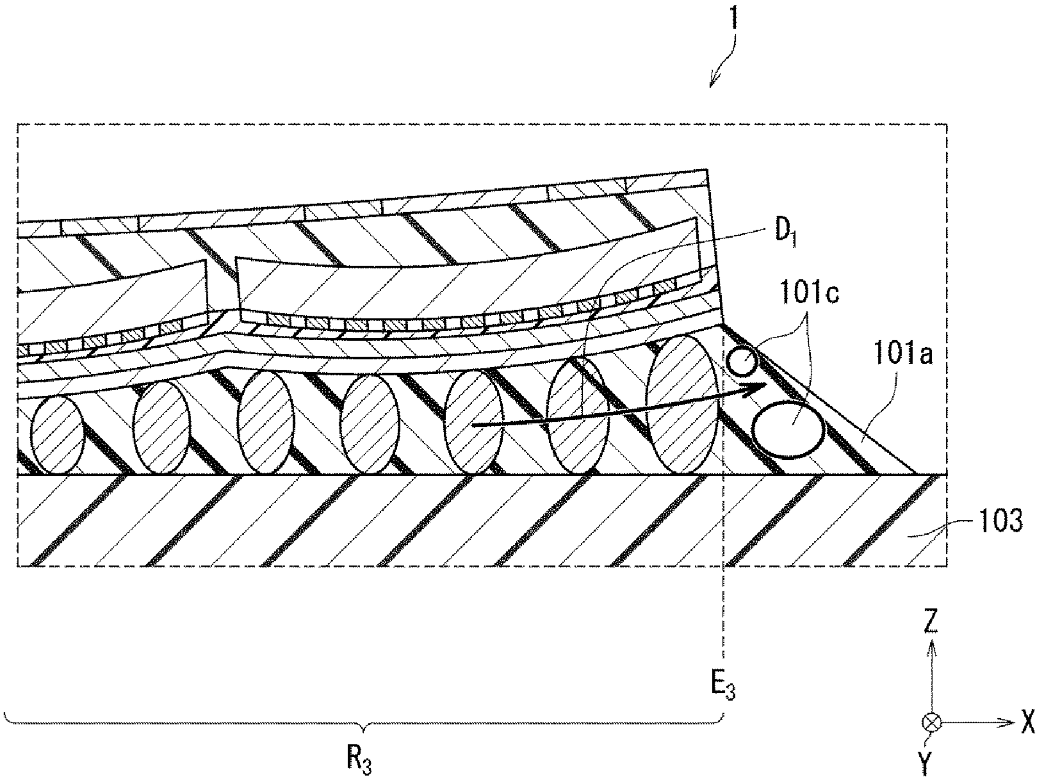
FIG. 5 is a diagram illustrating movements of voids during the manufacture of a package structure according to the second embodiment.

In addition to FIGS. 1 and 2, with reference to FIG. 4 and FIG. 5, operations and effects of the composite component 1 according to the present embodiment are described. FIG. 4 is a cross-sectional view of a package structure according to a second embodiment. FIG. 5 is an enlarged view of a portion corresponding to a portion C in FIG. 4, and illustrates movements of voids during the manufacture of the package structure according to the second embodiment.

The composite component 1 according to the present embodiment can restrict the reduction in electric connectivity and improve the reliability of an electronic device including the composite component 1. The reason for this can be inferred as follows.

As described above, the mount surface 3 of the composite component 1 according to the present embodiment includes one or more first curved surfaces 3_a_ that are curved to protrude in the mount direction to correspond to (reflect) the curved shape of one or more electronic components 21 in a cross-sectional view. Thus, as illustrated in FIG. 4, for example, in a package structure 100 in the composite component 1, an upper surface 101_b_ of an underfill layer 101 is in contact with the mount surface 3 of the composite component 1 curved to protrude vertically downward (that is, in the negative Z direction). Thus, as illustrated in FIG. 5, when the composite component 1 is to be mounted on a circuit board 103, an uncured underfill layer (a coating film 101_a_ formed from an underfill member) has a variance in thickness. More specifically, in FIG. 5, the thickness of the coating film 101_a_ of the underfill member disposed below the electronic component 21 at the right end gradually increases in a direction $D_1$. Specifically, this means that the coating film 101_a_ has a thickness gradient to gradually increase the cross section (the YZ cross section) of the path along which voids 101_c_ move in the direction $D_1$. With such a variance in thickness of the coating film 101_a_, the voids 101_c_ in the coating film 101_a_ of the underfill member move out of a mount surface region $R_3$ of the composite component 1 in the direction $D_1$, and move further out of the coating film 101_a_ of the underfill member. Thus, the underfill layer 101 in the package structure 100 includes fewer voids 101_c_. Thus, the present embodiment is considered to restrict the reduction in electric connectivity.

When the first curved surface 3_a_ of the mount surface 3 of the composite component 1 is a first curved surface that corresponds to the curved shape of one or more electronic components 21 in a cross-sectional view and that is curved to protrude in the mount direction, the upper surface of the underfill layer 101 in the package structure 100 in the composite component 1 is in contact with the mount surface 3 of the composite component 1 having a curved surface curved to protrude vertically downward. The voids 101_c_ formed in the coating film 101_a_ of the underfill member while the composite component 1 is mounted on the circuit board 103 are formed from, for example, air constituents in the atmosphere or vaporized constituents of the underfill member (more specifically, a vaporized solvent). For example, the coating film 101_a_ of the underfill member is formed from an adhesive such as a curing resin and a solvent for the adhesive. The specific gravity of the constituent of the voids 101_c_ is smaller than the specific gravity of the constituent of the coating film 101_a_ of the underfill member. The voids 101_c_ are allowed to easily move along the upper surface of the coating film 101_a_ of the underfill member while the composite component 1 is mounted on the circuit board 103. The upper surface of the coating film 101_a_ of the underfill member is in contact with the mount surface 3 of the composite component 1, and has a curved shape. Thus, the voids formed in the uncured underfill layer move out of the mount surface region $R_3$ of the composite component 1, and further move out of the coating film 101_a_ of the underfill member.

Thus, the composite component according to the present embodiment is considered to restrict the reduction in electric connectivity.

The inventors have studied the above issues to find the cause of the voids 101_c_ formed in the underfill layer 101. More specifically, the inventors have found that forming the coating film 101_a_ from the underfill member by filling a space between the mount surface 3 of the composite component 1 and the circuit board 103 with the underfill member while the composite component 1 is mounted on the circuit board 103 may involve trapping of air, which remains unremoved in the underfill layer 101 to form the voids 101_c_. The inventors have also found that evaporation of the solvent included in the coating film 101*a* of the underfill member forms the voids 101*c*.

The inventors have then studied a solution to the above issue based on these technical findings. The inventors have focused on the coating film 101*a* of the underfill member that can serve as a path along which the voids 101*c* move. The inventors have also focused on the package structure 100 in which the mount surface 3 of the composite component 1 is in contact with the upper surface of the underfill layer 101 and in which the shape of the mount surface 3 of the composite component 1 can control the shape of the coating film 101*a* of the underfill member. Based on these focused points, the inventors have further studied to find a shape of the coating film 101*a* of the underfill member that facilitates a movement out of the mount surface of the composite component 1 during the manufacture of the package structure. The inventors have conceived an idea that the coating film 101*a* of the underfill member having a variance in thickness is effective as an example of such a shape, and have derived a characteristic in claim 1 indicating "one or more of the plurality of electronic components have a curved shape that is curved to protrude in a mount direction in a cross-sectional view, and a mount surface of the composite component corresponds to the curved shape in a cross-sectional view, and includes one or more first curved surfaces that are curved to protrude in the mount direction".

The mount surface 3 of the composite component 1 includes multiple first curved surfaces 3*a*. In this case, the proportion of the area of the first curved surfaces 3*a* to the mount surface 3 of the composite component 1 increases. Thus, when the composite component 1 is to be mounted on the circuit board 103, the coating film 101*a* of the underfill member allows the voids 101*c* to more easily move away therefrom. Thus, the underfill layer 101 in the package structure 100 in the composite component 1 includes fewer voids 101*c*. Thus, the composite component 1 according to the present embodiment further restricts the reduction in electric connectivity.

In the mount surface 3 of the composite component 1, the first curved surfaces 3*a* make up equal to or more than 70% of the area of the entire mount surface 3 in a plan view. This proportion of the area can be determined in the following manner. The mount surface 3 of the composite component 1 is projected on a ZX plane to form a projection plane. The proportion of the area of the first curved surfaces 3*a* to the projection plane is calculated. More specifically, as illustrated in FIGS. 1 to 2, the mount surface 3 of the composite component 1 includes five first curved surfaces 3*a*, and the first curved surfaces 3*a* make up 100% of the entire area of the mount surface 3 of the composite component 1. In this case, the proportion of the area of the first curved surfaces 3*a* to the mount surface 3 of the composite component 1 is high. Thus, the coating film 101*a* of the underfill member allows the voids 101*c* to more easily move away therefrom when the composite component 1 is mounted on the circuit board 103. Thus, the underfill layer 101 in the package structure 100 in the composite component 1 includes fewer voids 101*c*. The composite component 1 according to the present embodiment further restricts the reduction in electric connectivity. The proportion of the area of the first curved surfaces 3*a* to the mount surface 3 can be controlled by, for example, the number of the one or more electronic components 21 in the composite component 1 having a shape curved in the mount direction in a cross-sectional view.

Method for Calculating Proportion of First Curved Surfaces to Mount Surface of Composite Component The proportion of the first curved surfaces 3*a* to the mount surface 3 of the composite component 1 can be calculated in the following manner. Specifically, the composite component 1 is cut to form a cross section (a ZX cross section) including the center of the composite component 1. An SEM image of the ZX cross section is captured. A first straight line passing the first intersection point and the second intersection point of each of the multiple electronic components 21 in the SEM image is formed. The sum of the length of the mount surface 3 from the first intersection point to the second intersection point (hereafter also referred to as "a total length of the mount surface 3") is calculated. The sum of the length of the surface of the region of the mount surface 3 that extends vertically downward (in the negative Z direction) beyond the first straight line (hereafter also referred to as "a total length of the first curved surfaces 3*a*") is calculated. The proportion (%) of the first curved surfaces to the mount surface of the composite component is calculated using a formula {(a total length of the first curved surfaces 3*a*)/(a total length of the mount surface 3)}×100. Herein, the center of the composite component 1 indicates an intersection point of two diagonals in the composite component 1 that is a rectangle in a plan view. A rectangle is not limited to a strict rectangle (more specifically, a rectangle or a square), and may have, for example, arc-shaped corners. When a rectangle has arc-shaped corners, the intersection point of diagonals can be derived using virtual corners.

The mount surface 3 of the composite component 1 corresponds to (reflects) the curved shape of one or more electronic components 21. More specifically, one first curved surface 3*a* of the mount surface 3 corresponds to the curved shape of one electronic component 21. In FIG. 1, five electronic components 21 each have a curved shape, and the mount surface 3 of the composite component 1 correspondingly has five first curved surfaces 3*a*.

In a cross-sectional view, at least two of the multiple first curved surfaces 3*a* of the mount surface 3 of the composite component 1 are adjacent to each other with a bend interposed therebetween. More specifically, in a cross-sectional view, the mount surface 3 of the composite component 1 has five first curved surfaces 3*a*, which are adjacent to each other with four bends 3*b* interposed therebetween. Thus, in the package structure 100 in the composite component 1, the upper surface 101*b* of the underfill layer 101 is in contact with the mount surface 3 of the composite component 1 having the above shape. When the composite component 1 is to be mounted on the circuit board 103, in addition to a variance in thickness, portions corresponding to the bends 3*b* of the mount surface 3 of the composite component 1 are formed in the uncured underfill layer (the coating film 101*a* of the underfill member). The portions corresponding to the bends 3*b* extend in the Y direction, and thus can serve as paths along which the voids 101*c* move. Thus, the coating film 101*a* of the underfill member allows the voids 101*c* formed in the coating film 101*a* to more easily move out of the mount surface 3 region $R_3$ of the composite component 1 in a plan view. Thus, the composite component 1 according to the present embodiment further restricts the reduction in electric connectivity.

The entirety of the composite component 1 may be curved to protrude in the mount direction. In the package structure 100 in the composite component 1, the upper surface 101*b* of the underfill layer 101 is in contact with the mount surface of the composite component 1 that has a shape curved to protrude vertically downward with respect to the entire mount surface of the circuit board 103. Thus, when the composite component 1 is to be mounted on the circuit board 103, the uncured underfill layer (the coating film 101*a* of the underfill member) having a variance in thickness allows the voids 101*c* in the coating film 101*a* of the underfill member to more easily move out of the mount surface region $R_3$ of the composite component 1. Thus, the voids 101*c* formed in the coating film 101*a* of the underfill member move out of the mount surface region $R_3$ of the composite component 1 in a plan view, and more easily move out of the coating film 101*a* of the underfill member. Thus, the composite component 1 according to the present embodiment further restricts the reduction in electric connectivity.

Method for Checking Whether Entirety of Composite Component 1 is Curved to Protrude in Mount Direction Whether the entirety of the composite component 1 is curved to protrude in the mount direction can be checked in the following manner. More specifically, a cross section (the ZX cross section) including the center of the composite component 1 is formed. An SEM image of the ZX cross section is captured. A second straight line that passes, in the SEM image, a third intersection point of the first end surface of the composite component 1 and a component surface (a surface of an interposer electrode layer 19 that can receive another electronic component) and a fourth intersection point of the second end surface of the composite component 1 and the component surface is formed. Whether the entirety of the component surface is located in the negative Z direction from the second straight line is checked. When the entirety of the component surface is located in the negative Z direction from the second straight line, and the curved surface can fit to the component surface, the entirety of the composite component 1 is determined as being curved to protrude in the mount direction. The center of the composite component 1 indicates the intersection point of two diagonals of the composite component 1 that is rectangular in a plan view.

The composite component 1 has the multiple electronic components 21 secured in the interposer structure 10. In other words, the composite component 1 is a composite component with built-in electronic components.

(Electronic Component Layer)

The electronic component layer 20 is disposed between the interposer electrodes 19*a* and the Si base layer 13. The electronic component layer 20 is bonded to the second main surface 13*b* of the Si base layer 13 with the adhesive layer 11 interposed therebetween. The electronic component layer 20 includes the multiple electronic components 21, and also includes a resin seal portion 23 with which the multiple electronic components 21 are sealed.

(Multiple Electronic Components)

The multiple electronic components 21 in the electronic component layer 20 are sealed with the resin seal portion 23. In each of the multiple electronic components 21, the component electrodes 21*b* are electrically connected to the rerouting layer 15 with the through-silicon vias 17, and the component electrodes 21*b* and a third main surface 21*d* are bonded to the second main surface 13*b* of the Si base layer 13 with the adhesive layer 11 interposed therebetween.

In the multiple electronic components 21, the component electrodes 21*b* are disposed in the electronic component layer 20 while being electrically connected to the rerouting layer 15 via the through-silicon vias 17 extending linearly. In other words, in each of the multiple electronic components 21 in the electronic component layer 20, the third main surface 21*d* of the electronic component body 21*a* opposite to a fourth main surface 21*e* is located closer to the rerouting layer 15. More specifically, the multiple electronic components 21 are disposed in the same direction in the electronic component layer 20. Compared to the case where the multiple electronic components 21 are disposed in different directions in the electronic component layer 20, the curves of the electronic components 21 disposed in the same direction in the electronic component layer 20 as described above are less easily offset, and the entirety of the composite component 1 is more easily curved to protrude in the mount direction. Thus, the composite component 1 further restricts the reduction in electric connectivity.

Also in this case, the composite component 1 has a simpler wiring than in the case where the multiple electronic components 21 are disposed in different directions. Thus, the composite component 1 can reduce the wiring length to reduce line resistance and reduce costs.

Each of the multiple electronic components 21 includes the electronic component body 21*a* and the component electrodes 21*b* disposed on the electronic component body 21*a*. Each of the multiple electronic components 21 is, for example, an electronic component including one or more elements integrated in a substance similar to the substance forming the Si base layer 13. The electronic components 21 are, for example, active components (more specifically, central processing units or CPUs, graphical processing units or GPUs, and large-scale integrated circuits or LSIs) and passive components (more specifically, capacitors, resistors, and inductors).

The electronic component body 21*a* has the third main surface 21*d* and the fourth main surface 21*e* that are opposite to each other. The electronic component body 21*a* includes, for example, a ceramic or semiconductor material (more specifically, for example, silicon).

The component electrodes 21*b* are disposed on the third main surface 21*d* of the electronic component body 21*a*. The component electrodes 21*b* are electrically connected to the through-silicon vias 17. The component electrodes 21*b* are formed from an electroconductive material such as Cu, Ni, Sn, Al, or an alloy containing any of these metals. Among these, the electroconductive material is preferably the same material as that for the through-silicon vias 17. The thickness of the component electrodes 21*b* is, for example, 1 to 30 μm, and preferably, smaller than or equal to 5 μm. The component electrodes 21*b* can be reduced to the thickness of 1 to 5 μm. The thickness of the component electrodes 21*b* can be reduced to, for example, ¼ to ⅙ of the thickness of the electronic component body 21*a*.

(One or More Electronic Components)

In a cross-sectional view, one or more of the multiple electronic components 21 each have a curved shape that is curved to protrude in the mount direction of the composite component 1. In FIG. 1, in a cross-sectional view, the entireties of all the five electronic components 21 included in the composite component 1 have a curved shape that is curved to protrude in the mount direction of the composite component 1. The thickness of the one or more electronic components 21 is, for example, 80 to 120 μm.

Herein, the curved shape of the one or more electronic components 21 is a shape of a curve protruding in the mount direction (in the negative Z direction from a third straight line described below) in a cross-sectional view (in a view of a ZX cross section). Thus, as illustrated in FIG. 1, instead of an arc shape where the entirety of the one or more electronic components 21 is curved to protrude, the curved shape may be, for example, a shape where part of the one or more electronic components 21 is curved in the mount direction.

Examples of the shape partially curved in the mount direction include a curved shape including multiple different types of curves. The curved shape can be controlled by, for example, an arrangement of a resin layer 21*c* and the component electrodes 21*b*. The curvature of the curved shape can be controlled by the thickness of the resin layer 21*c* and the electronic component body 21*a* and the heating conditions in the manufacturing method (more specifically, for example, a heating temperature and heating time).

Method for Checking Curved Shape

Whether the one or more electronic components 21 have a curved shape can be checked in the following manner. Specifically, the composite component 1 is cut to form a cross section (the ZX cross section) including the center portion (the definition is described below) of a target electronic component 21 in the one or more electronic components 21. An SEM image of the ZX cross section is captured. A third straight line that passes, in the SEM image, a fifth intersection point of the third main surface 21*d* of the electronic component body 21*a* and the first end surface $E_1$ and a sixth intersection point of the third main surface 21*d* and the second end surface $E_2$ is formed. Whether any region of the electronic component body 21*a* extends beyond the third straight line in the negative Z direction is checked. When any region of the electronic component body 21*a* extends beyond the third straight line, and the third main surface 21*d* of the electronic component body 21*a* that extends beyond the third straight line in the negative Z direction fits to the curved surface, the target electronic component 21 is determined to have the curved shape. In a case where the one or more electronic components 21 include multiple electronic components 21, each of the electronic components 21 can be checked for the curved shape.

In addition to the electronic component body 21*a* and the component electrodes 21*b*, one or more of the multiple electronic components 21 also include the resin layer 21*c* disposed between the component electrodes 21*b*. The one or more electronic components 21 including the resin layer 21*c* between the component electrodes 21*b* can have a curved shape that is curved to protrude in a cross-sectional view. The reason for this can be inferred as follows. The resin layer 21*c* more easily expands, for example, with heat, than the electronic component bodies 21*a* of the electronic components 21. Thus, for example, the one or more electronic components 21 can have a curved shape that is curved to protrude toward the resin layer 21*c* (in the mount direction) during the manufacture of the composite component 1.

The resin layer 21*c* also functions as a layer that electrically isolates the component electrodes 21*b* from each other. The thickness of the resin layer 21*c* is, for example, 1 to 30 μm, and preferably smaller than or equal to 5 μm. The component electrodes 21*b* can be thinned to the thickness of 1 to 5 μm. The thickness of the resin layer 21*c* can be reduced to, for example, ¼ to ⅙ of the thickness of the electronic component body 21*a*.

The thickness of the resin layer 21*c* may be the same as the component electrodes 21*b*. In this case, the upper surface of the resin layer 21*c* and the upper surfaces of the component electrodes 21*b* are flush with each other.

The coefficient of linear expansion of the resin layer 21*c* may be greater than the coefficient of linear expansion of the electronic component body 21*a*. For example, the coefficient of linear expansion of the resin layer 21*c* may be 10 to 30 times as large as the coefficient of linear expansion of the electronic component body 21*a*. The coefficient of linear expansion of the resin layer 21*c* is, for example, 30 to 150 ppm/° C. The coefficient of linear expansion of the material forming the electronic component body 21*a* is, for example, 1 to 25 ppm/° C. For example, during the manufacture of the composite component 1, the resin layer 21*c* of the one or more electronic components 21 is disposed closer to the mount surface 3 of the composite component 1 than the electronic component body 21*a*, and expands with heat further than the electronic component body 21*a*. Thus, during the manufacture of the composite component 1, the one or more electronic components 21 including the resin layer 21*c* can have a shape that is curved to protrude in the mount direction. Thus, the one or more electronic components 21 in the composite component 1 can have a curved shape that is curved to protrude in the mount direction in the composite component 1.

The resin layer 21*c* includes, for example, resin. In this case, when the electronic component body 21*a* includes a ceramic or semiconductor material, the coefficient of linear expansion of the resin layer 21*c* is more likely to be greater than the coefficient of linear expansion of the electronic component body 21*a*. Examples of ceramics include oxides such as alumina and zirconia, carbides such as silicon carbide, and nitrides such as silicon nitride. Examples of the semiconducting material include a semiconductor material (more specifically, a simple substance such as C, Si, and Ge, and a compound such as SiC and SiGe) including group 14 nonmetal elements, a compound semiconductor material (more specifically, for example, GaAs, GaP, GaN, InSb, and InP) including group 13 elements and group 15 elements, and a compound semiconductor material (more specifically, for example, ZnSe, CdS, and ZnO) including group 12 elements and group 14 elements.

(Resin Seal Portion)

The resin seal portion 23 includes a resin (for example, epoxy resin) and can integrate the multiple electronic components 21 with the resin. Since the resin seal portion 23 can integrate the multiple electronic components 21 with resin, regardless of when the entirety of one or more electronic components 21 has a curved shape that is curved to protrude in the mount direction in a cross-sectional view, the one or more electronic components 21 can be located in the electronic component layer 20. Regardless of when an electronic component (more specifically, a general-purpose electronic component) has dimensions that do not match the dimensions of the Si base layer 13, the electronic component can be located in the electronic component layer 20. Thus, a low-cost high-performance electronic component can be used. In addition, this structure enables highly flexible designing, and combining of electronic components in accordance with the purpose of use. For example, the composite component 1 can include various different types of built-in electronic components.

(Interposer Structure)

The interposer structure 10 includes the Si base layer 13 having the first main surface 13*a* and the second main surface 13*b* that are opposite to each other, the rerouting layer 15 disposed on the first main surface 13*a*, the through-silicon vias 17 that are through-hole electrodes electrically connected to the rerouting layer 15 and extending through the Si base layer 13, and the interposer electrode layer 19 that faces the second main surface 13*b*. The interposer structure 10 allows the electronic component layer 20 to be interposed between the Si base layer 13 and the interposer electrode layer 19. The interposer structure 10 also includes the adhesive layer 11 that bonds the multiple electronic components 21 to the second main surface 13*b* of the Si base layer 13. The interposer structure 10 connects, for example, a package substrate with different terminal pitches and the multiple electronic components 21 to each other.

(Si Base Layer)

The Si base layer 13 includes the first main surface 13*a* and the second main surface 13*b* that are opposite to each other. The thickness of the Si base layer 13 is, for example, smaller than or equal to 150 μm, preferably smaller than or equal to 50 μm, or more preferably smaller than or equal to 30 μm. The reason why the Si base layer 13 can be extremely thinned is because, in a method for manufacturing the composite component 1 described below, an Si support 33 is bonded to the Si base layer 13 for reinforcement, and thus the Si base layer 13 is less easily broken (for example, cracked) due to the shortage in strength regardless of when the Si base layer 13 is ground to be thinned (refer to FIG. 3G). The reinforcement with the Si support 33 enables the manufacture of the composite component 1. The Si base layer 13 can thus be extremely thinned further than an existing Si base layer. Thus, the length of the via wiring that establishes electrical connection from the component electrodes 21*b* of the multiple electronic components 21 to the rerouting layer 15 can be shortened. The Si base layer 13 is substantially formed from Si.

The thickness of the Si base layer 13 can be further reduced than the thickness of the multiple electronic components 21. When the thickness of the Si base layer 13 is further reduced than the thickness of the multiple electronic components 21, the mount surface 3 of the composite component 1 can easily reflect the curved shape of the one or more electronic components 21. For example, the thickness of the Si base layer 13 is preferably smaller than or equal to 50% or more preferably smaller than or equal to 20% of the thickness of the multiple electronic components 21. The thickness of the multiple electronic components 21 is, for example, 30 to 120 μm. When the thickness of the Si base layer 13 is smaller than or equal to 50 μm, the length of the via wiring from the rerouting layer 15 to the component electrodes 21*b* can be further reduced than an existing length (for example, about 100 μm). Thus, the parasitic impedance attributable to the via wiring can be reduced, and the electric characteristics of an electronic device including the composite component 1 can be improved. Examples of the decrease in electric characteristics include the decrease of the functionality in reducing supply voltage fluctuations of a high-speed-driving semiconductor device IC mounted on the rerouting layer 15, and the decrease of the functionality in absorbing high-frequency ripples of the semiconductor device IC.

(Rerouting Layer)

The rerouting layer 15 is disposed on the first main surface 13*a* of the Si base layer 13. The rerouting layer 15 is a multilayer wiring layer. The rerouting layer 15 converts, for example, a wiring layout of the through-silicon vias 17 on the first main surface 13*a* of the Si base layer 13 into a component electrode layout of another electronic component disposed on the rerouting layer 15. In other words, the rerouting layer 15 electrically connects the through-silicon vias 17 to another electronic component disposed on the rerouting layer 15 to form an intended electric circuit. The rerouting layer 15 includes wirings (electroconductive wirings) 15*b* and a dielectric film 15*a*.

The wirings 15*b* include electroconductive vias. The electroconductive vias electrically connect wirings between different layers in the rerouting layer 15. The wirings 15*b* include an electroconductive material. The electroconductive material is, for example, Cu, Ag, Au, or an alloy including any of these metals, and preferably Cu among these. The rerouting layer 15 can include multiple layers, for example, two or more wirings 15*b* and one or more dielectric films 15*a*. The thickness of one wiring 15*b* and the thickness of one dielectric film 15*a* in the rerouting layer 15 are, for example, 1.5 to 5.0 μm. In this case, the thickness of the rerouting layer 15 is calculated as the product (in micrometers) of the thickness (1.5 to 5.0 μm) of a single layer multiplied by the total number of layers within the rerouting layer 15.

The dielectric film 15*a* includes an insulating material. Examples of an insulating material include an organic insulating material and an inorganic insulating material. Examples of an organic insulating material include epoxy resin, silicone resin, polyester, polypropylene, polyimide, acrylonitrile-butadiene-styrene (ABS) resin, acrylonitrile-styrene (AS) resin, methacrylic resin, polyamide, fluororesin, liquid crystal polymer, polybutylene terephthalate, and polycarbonate. Examples of an inorganic insulating material include silicon oxide ($SiO_2$) and silicon nitride (SiN or $Si_3N_4$).

The thickness of the dielectric film 15*a* is, for example, 0.1 to 2 The dielectric film 15*a* may be a multicomponent film including two or more components. The multicomponent film may be a multilayer film including multiple layers each having a different component. The multilayer film has a layer structure including, for example, in order from the side closer to the Si base layer 13, $SiO_2$ (with a thickness of 0.25 μm), $Si_3N_4$ (with a thickness of 0.1 μm), $SiO_2$ (with a thickness of 0.25 μm), and $Si_3N_4$ (with a thickness of 0.1 μm).

(Through-Silicon Via)

The through-silicon vias 17 are electrically connected to the rerouting layer 15, and extend through the Si base layer 13. Each through-silicon via 17 includes a through-silicon via body 17*a* and an extension 17*b*. The through-silicon via body 17*a* is electrically connected to the rerouting layer 15, and extends through the Si base layer 13. The extension 17*b* is electrically connected to the through-silicon via body 17*a*, extends from the second main surface 13*b* of the Si base layer 13 through the adhesive layer 11, and is electrically connected to the corresponding component electrode 21*b*. In this manner, the via wiring that establishes electrical connection from the component electrodes 21*b* to the rerouting layer 15 is simply formed from the through-silicon vias 17 without including solder bumps. Thus, the composite component 1 according to the present embodiment can further reduce the parasitic impedance attributable to the via wiring. Thus, the electronic device including the composite component 1 improves electronic characteristics. In addition, the electronic device including the composite component 1 can further reduce the wiring length than an existing length. Thus, the composite component 1 can reduce its thickness to achieve size reduction or thickness reduction. The length of the via wiring (that is, the dimension of the through-silicon vias 17 in a lamination direction) is, for example, 3 to 36 μm.

In FIG. 2, the through-silicon vias 17 are substantially linear in the lamination direction. The shape of the through-silicon vias 17 in a cross section in the ZX plane is substantially rectangular in FIG. 2, but is not limited to this, and may be a tapered shape in the lamination direction. The shape of the through-silicon vias 17 in a cross section in the XY plane is, for example, substantially circular, substantially polygonal, or substantially polygonal and having rounded corners.

The shape of the component electrodes 21*b* in a cross section in a plane (the XY plane) perpendicular to the lamination direction of the composite component 1 is substantially rectangular.

(Interposer Electrode Layer)

The interposer electrode layer 19 is a layer that is to be interposed between the composite component 1 and a different electronic component to mount the different electronic component on the composite component 1. The interposer electrode layer 19 is a layer that is to be interposed between the composite component 1 and an electronic device to mount the composite component 1 on the electronic device. The interposer electrode layer 19 includes the interposer electrodes 19*a* and a dielectric film. Each interposer electrode 19*a* electrically connects the composite component 1 and another electronic component or an electronic device to each other. The dielectric film electrically isolates the composite component 1 from another electronic component or an electronic device at required portions. The interposer electrodes 19*a* face the second main surface 13*b* of the Si base layer 13. The interposer electrodes 19*a* are formed from, for example, Cu, Ag, Au, or an alloy including any of these metals, and preferably Cu among these.

The interposer electrodes 19*a* are electrically connected to the electronic device with solder bumps. The interposer electrodes 19*a* may be plated with Ni or Au on the surface to cope with the solder bumps. The composite component 1 according to the present embodiment has a shape curved to protrude toward the mount surface, and thus may have a variance in height with respect to the circuit board 103. However, when the composite component 1 according to the present embodiment establishes electrical connection with the electronic device using the solder bumps, the solder bumps adjust the variance in height to enable junction between the composite component 1 and the electronic device. Thus, the composite component 1 can restrict the reduction in electric connectivity attributable to a variance in height. In other words, the present embodiment having an interposer structure including the interposer electrodes 19*a* can restrict the reduction in electric connectivity.

(Adhesive Layer)

The adhesive layer 11 bonds and secures the electronic component layer 20 to the interior of the interposer structure 10. More specifically, the adhesive layer 11 bonds the electronic component layer 20 to the second main surface 13*b* of the Si base layer 13.

Herein, the thickness of the adhesive layer 11 indicates the thickness in the Z direction from the lower surface of the component electrodes 21*b* to the second main surface 13*b* of the Si base layer 13. The one or more electronic components 21 have a curved shape that is curved to protrude in the mount direction. Thus, in a cross-sectional view, the thickness in the region of the adhesive layer 11 located between the one or more electronic components 21 and the second main surface 13*b* of the Si base layer 13 is smaller at a center portion 11*a* (a center portion 11*a* of the adhesive layer 11) than at end portions 11*b* (end portions 11*b* of the adhesive layer 11). In other words, the thickness of the adhesive layer 11 with the one or more electronic components 21 in the Z direction is smaller at the portion corresponding to the center portion of the one or more electronic components 21 (at the center portion 11*a* of the adhesive layer 11) than at portions corresponding to both end portions of the one or more electronic components 21 (that is, at the end portions 11*b* of the adhesive layer 11). Thus, the uncured adhesive layer (that is, an adhesive coating film 31) that can serve as a path along which voids 31*c* move during the manufacture of the composite component 1 has a greater thickness at the end portions than the thickness at the center portion in a cross-sectional view. Thus, the voids 31*c* formed in the adhesive coating film 31 can easily move out of the uncured mount surface receiving the electronic components 21, and further move out of the adhesive coating film 31 (the detail of this movement is described in an electronic component bonding process in the method for manufacturing the composite component 1). Thus, the obtained adhesive layer 11 includes fewer voids 31*c*, and the composite component according to the present embodiment further restricts the reduction in electric connectivity.

Herein, the center portion of the one or more electronic components 21 indicates a range with a length $L_1$ in the X direction with respect to a middle $C_1$ between end surfaces $E_1$ and $E_2$ of the electronic component 21 at the center, in a cross section (for example, the ZX plane as illustrated in FIGS. 1 and 2) including the intersection point of the diagonals of the target rectangular electronic component 21 when the composite component 1 is viewed in a plan in the Z direction. The length $L_1$ is, for example, 0 to 50 μm. When the length $L_1$ is 0 μm, the center portion corresponds to the middle $C_1$. Herein, the end portions of the one or more electronic components 21 indicate ranges with a length $L_2$ from the end surfaces $E_1$ and $E_2$ of the electronic component 21 in a cross section including the intersection point of the diagonals of the target rectangular electronic component 21 when the composite component 1 is viewed in a plan in the Z direction. The length $L_2$ is, for example, 0 to 50 When the length $L_2$ is 0 μm, the end portions correspond to the end surfaces $E_1$ and $E_2$. Herein, a rectangle is not limited to a strict rectangle (more specifically, a rectangle or a square), and may have, for example, arc-shaped corners. When a rectangle has arc-shaped corners, the intersection point of diagonals can be derived using virtual corners.

The thickness of the adhesive layer 11 at the center portion of the one or more electronic components 21 forms a cross section (the ZX cross section) of the composite component 1, and an SEM image of the cross section is captured using a scanning electron microscope (SEM). In the SEM image, the thickness of the adhesive layer 11 at the center portion (the center portion 11*a* of the adhesive layer 11) is measured multiple times (number of measurements $n \geq 3$). A mean value of the obtained multiple measurements is defined as a thickness of the adhesive layer 11 at the center portion. The thickness of the adhesive layer 11 at portions corresponding to the end portions of the one or more electronic components 21 (the end portions 11*b* of the adhesive layer 11) forms a cross section (the ZX cross section) of the composite component 1, and a SEM image is captured using a scanning electron microscope. In the SEM image, the thickness of the adhesive layer 11 at the end portions is measured multiple times (number of measurements $n \geq 3$). A mean value of the obtained multiple measurements is defined as a thickness of the adhesive layer 11 at the end portions. The case where the thickness at the center portion is smaller than the thickness at the end portions may include a case where the thickness at the center portion is smaller than the thickness of at least one of both end portions.

The thickness of the adhesive layer 11 at a portion corresponding to the center portion of the one or more electronic components 21 is, for example, smaller than or equal to 10 μm, and preferably smaller than or equal to 5 μm. When the thickness of the adhesive layer 11 is smaller than or equal to 10 μm, the dimension of the through-silicon vias 17 in the lamination direction (electric connection paths) is reduced, the direct current resistance Rdc and the thermal resistance are reduced, and the characteristics of the electronic component module is improved. In addition, when the thickness of the adhesive layer 11 is smaller than or equal to 10 μm, the thickness of the composite component 1 is reduced. Thus, an electronic component including the composite component 1 achieves size reduction or thickness reduction.

[Method for Manufacturing Composite Component]

A method for manufacturing a composite component 1 according to a first embodiment includes, for example, a resin layer forming process of forming the resin layer 21*c* between the component electrodes 21*b* of each of the electronic components 21, an electronic component bonding process of forming the adhesive layer 11 on the Si base layer 13, and bonding each of the multiple electronic components 21 onto the Si base layer 13 while having the component electrodes 21*b* and the resin layer 21*c* facing the Si base layer 13 with the adhesive layer 11 interposed therebetween, and an electronic component sealing process of forming the electronic component layer 20 obtained by sealing the multiple electronic components 21 bonded onto the Si base layer 13 with resin to form an integrated unit. The method also includes a through-hole forming process of forming through-holes 13*c* and 11*c* in the Si base layer 13 and the adhesive layer 11 by etching to expose the component electrodes 21*b* in the electronic components 21, and a through-silicon via forming process of forming the through-silicon vias 17 in the through-holes 13*c* and 11*c* by electroplating.

The method for manufacturing the composite component 1 also includes a Si-base-layer preparing process of preparing the Si base layer 13, an electronic-component-layer thinning process of grinding and thinning the electronic component layer 20, an Si-support bonding process of bonding the Si support 33 to the electronic component layer 20, an Si-base-layer thinning process of thinning the Si base layer 13 facing the Si support 33 with the electronic component layer 20 interposed therebetween, and a dielectric-film forming process of forming the dielectric film 15*a* with a predetermined pattern on the Si base layer 13. The method further includes a rerouting-layer forming process of forming the rerouting layer 15, an interposer-electrode forming process of forming the interposer electrodes 19*a*, and a dicing process of cutting a motherboard assembly into pieces with a dicing machine.

Figure 3A:
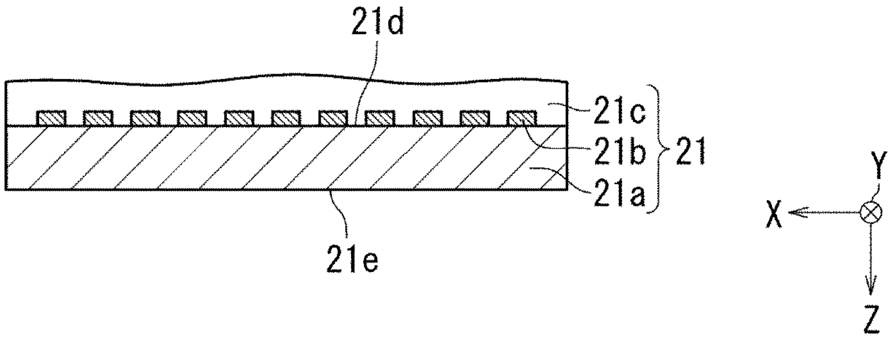
FIG. 3A is a diagram illustrating a method for manufacturing a composite component.
Figure 3B:
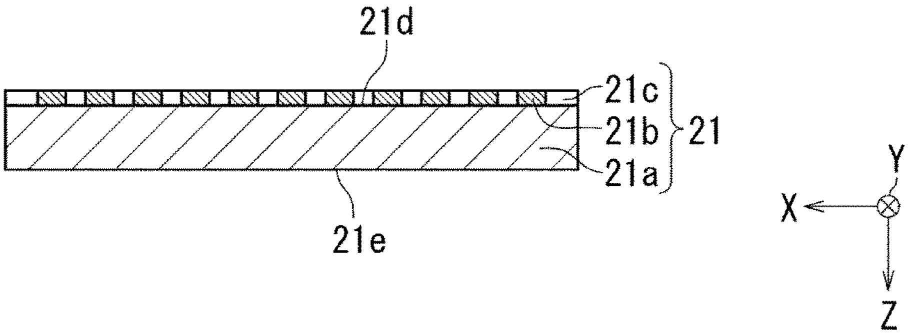
FIG. 3B is a diagram illustrating a method for manufacturing a composite component.
Figure 3C:
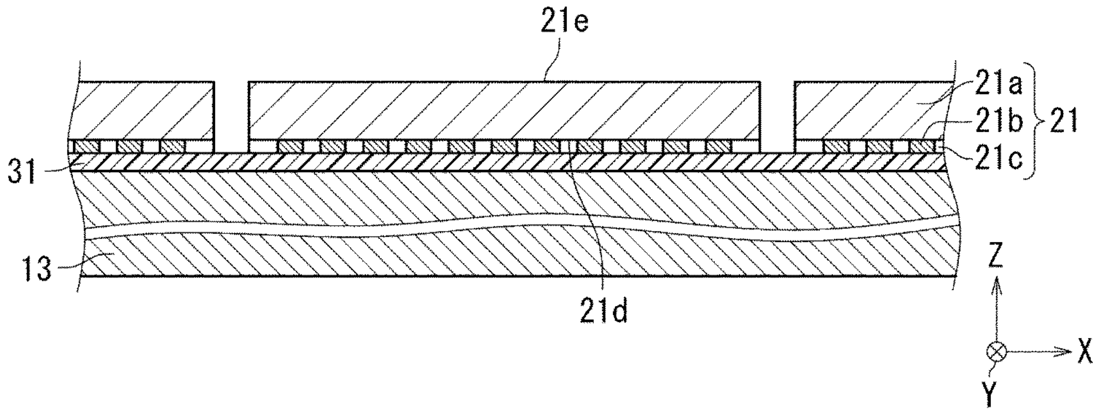
FIG. 3C is a diagram illustrating a method for manufacturing a composite component.
Figure 3D:
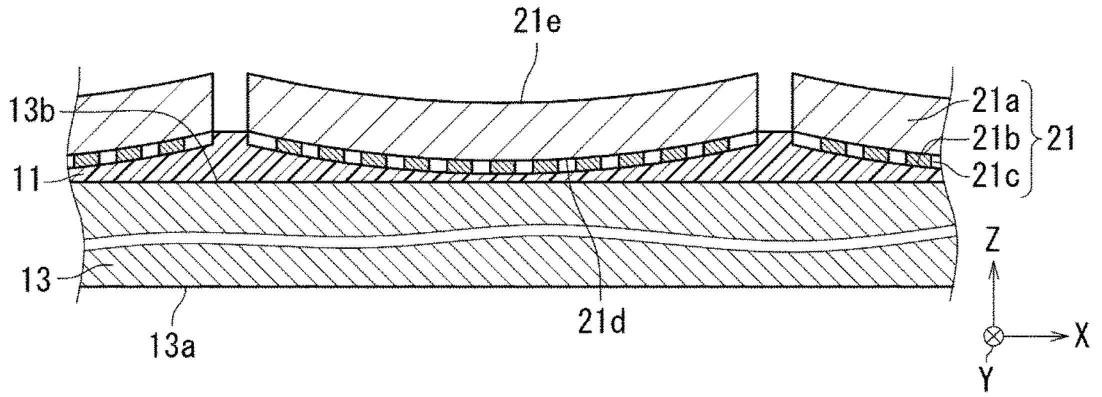
FIG. 3D is a diagram illustrating a method for manufacturing a composite component.
Figure 3E:
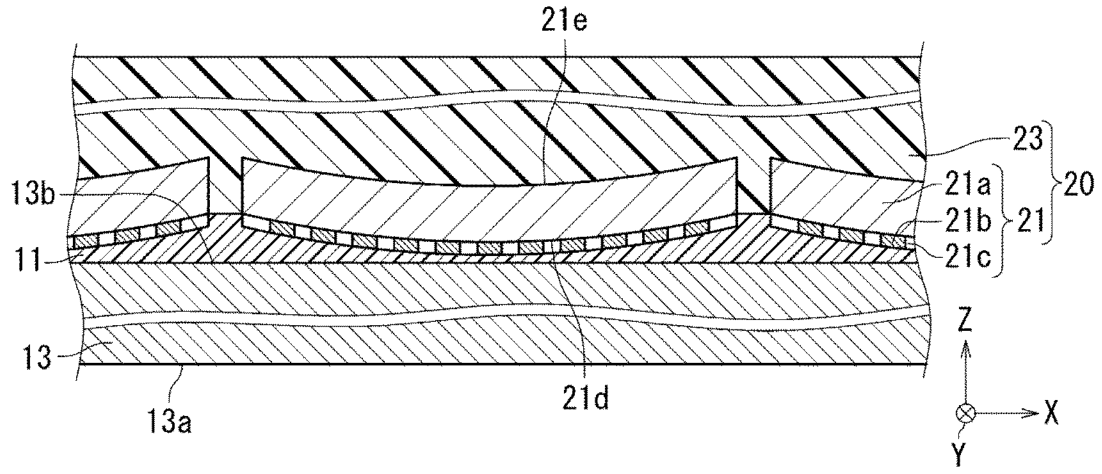
FIG. 3E is a diagram illustrating a method for manufacturing a composite component.
Figure 3F:
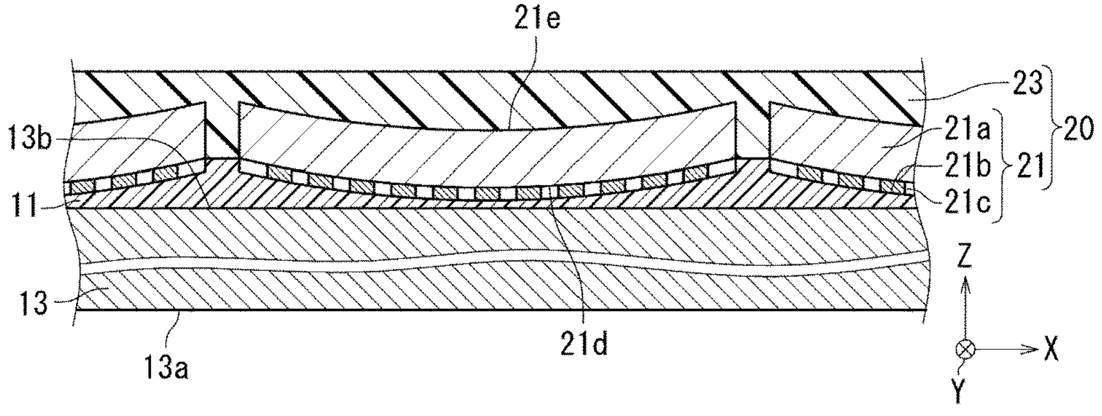
FIG. 3F is a diagram illustrating a method for manufacturing a composite component.
Figure 3G:
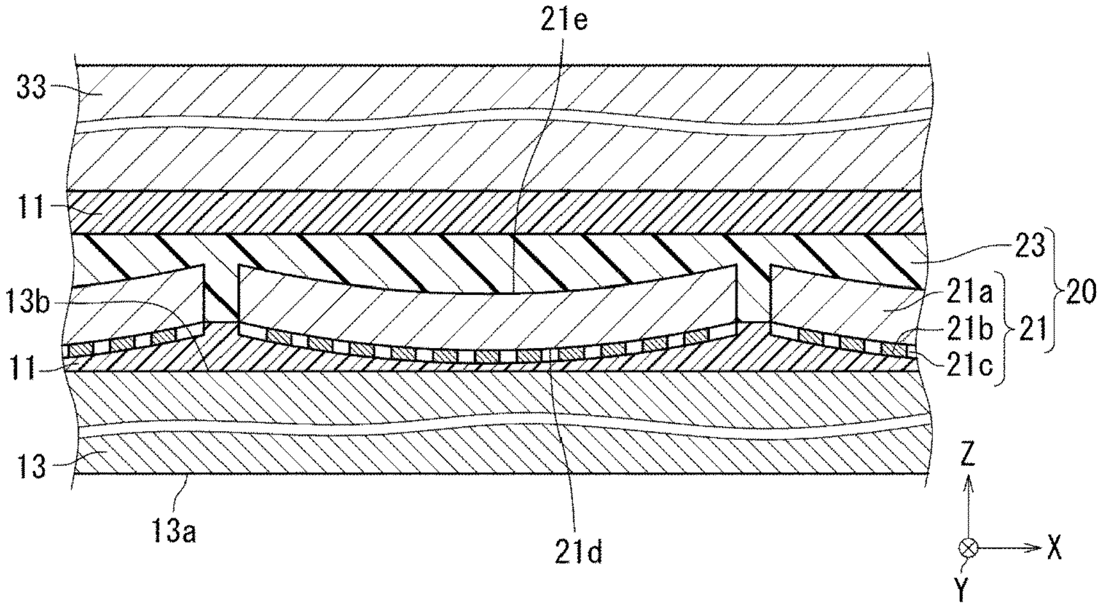
FIG. 3G is a diagram illustrating a method for manufacturing a composite component.
Figure 3H:
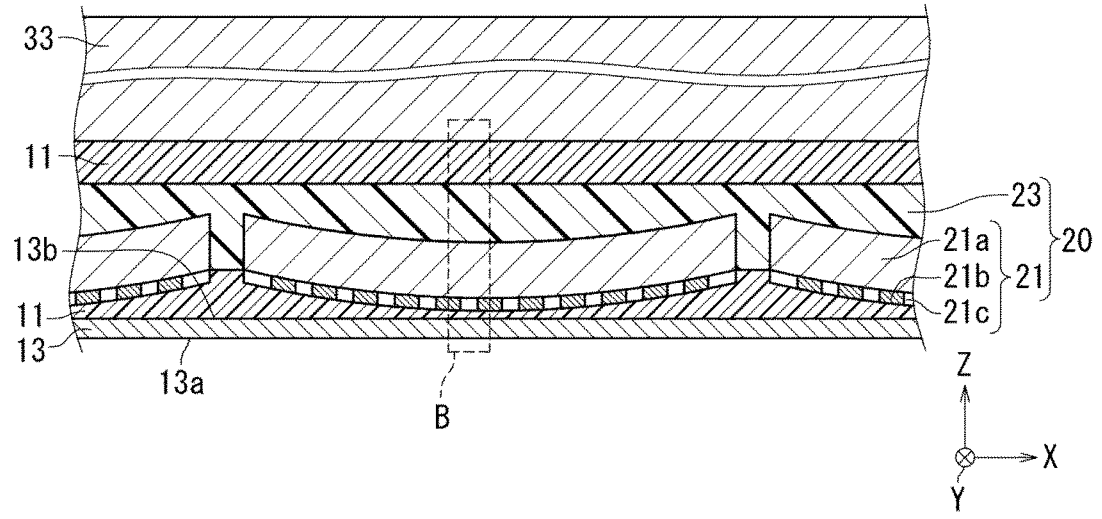
FIG. 3H is a diagram illustrating a method for manufacturing a composite component.
Figure 3I:
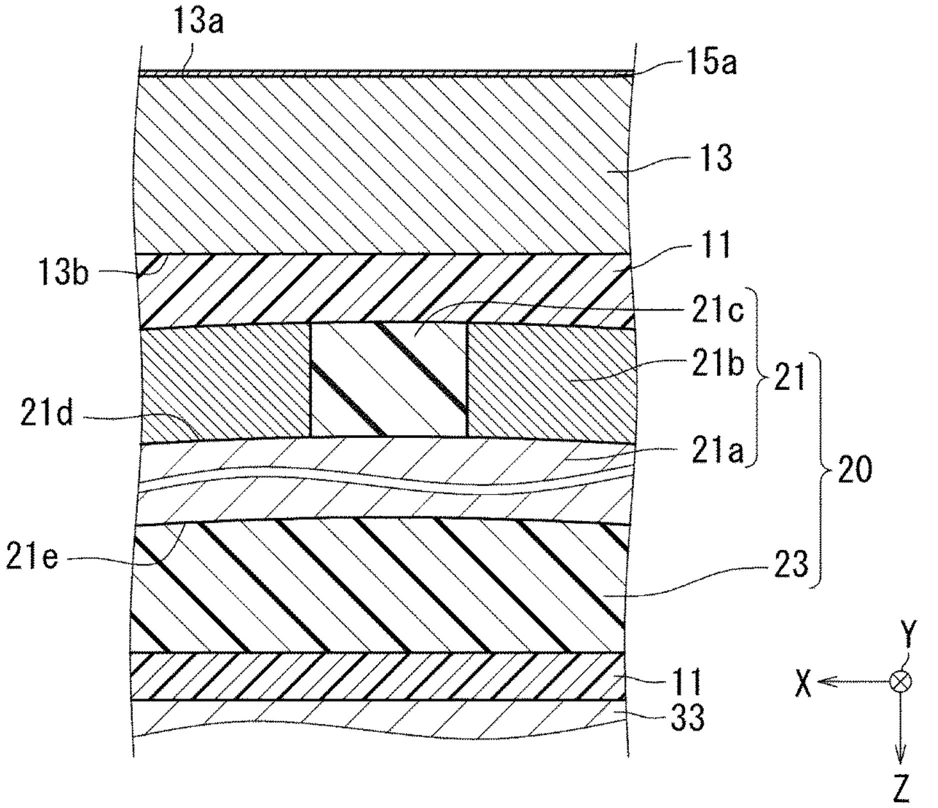
FIG. 3I is a diagram illustrating a method for manufacturing a composite component.
Figure 3J:
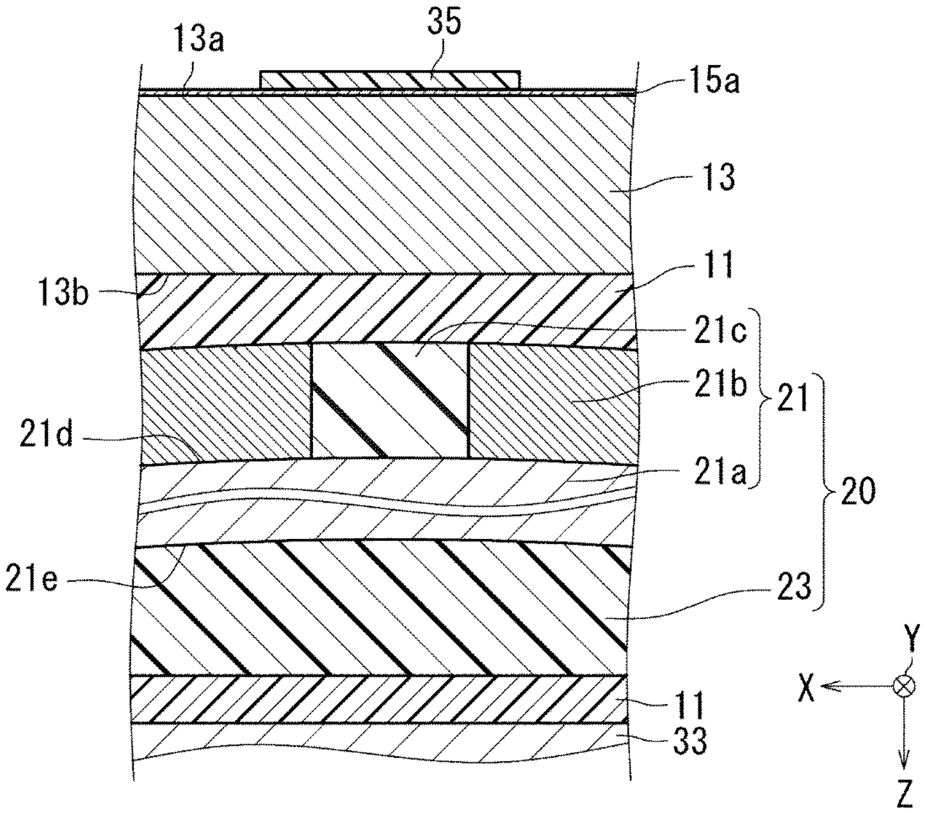
FIG. 3J is a diagram illustrating a method for manufacturing a composite component.
Figure 3K:
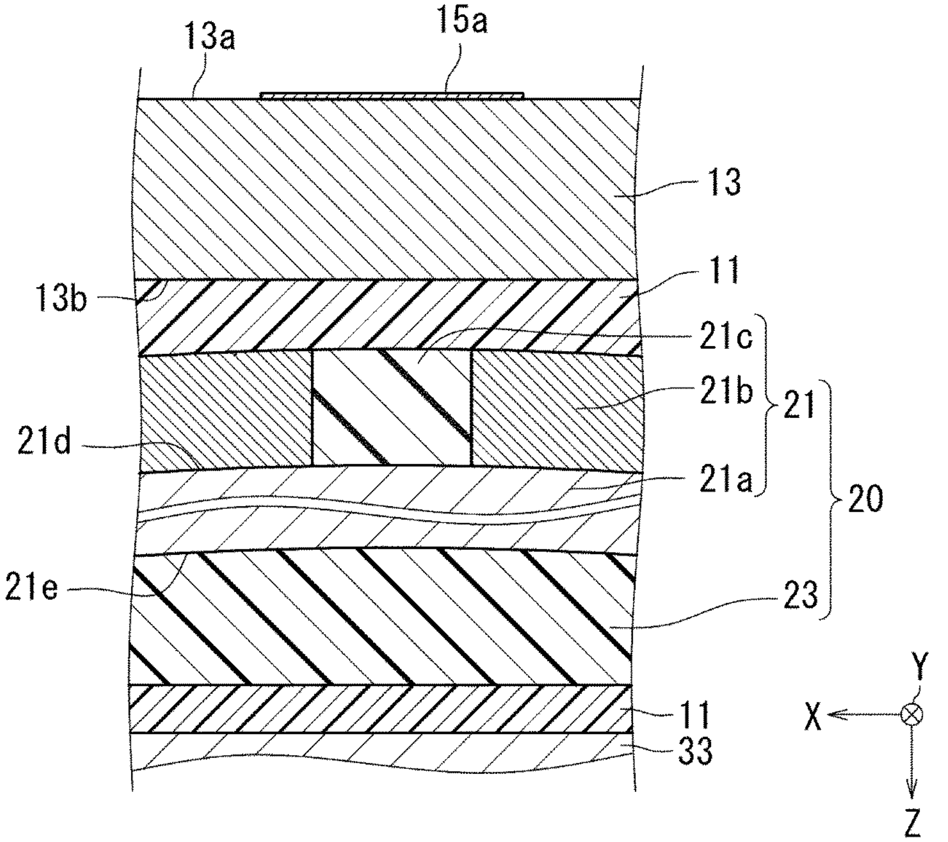
FIG. 3K is a diagram illustrating a method for manufacturing a composite component.
Figure 3L:
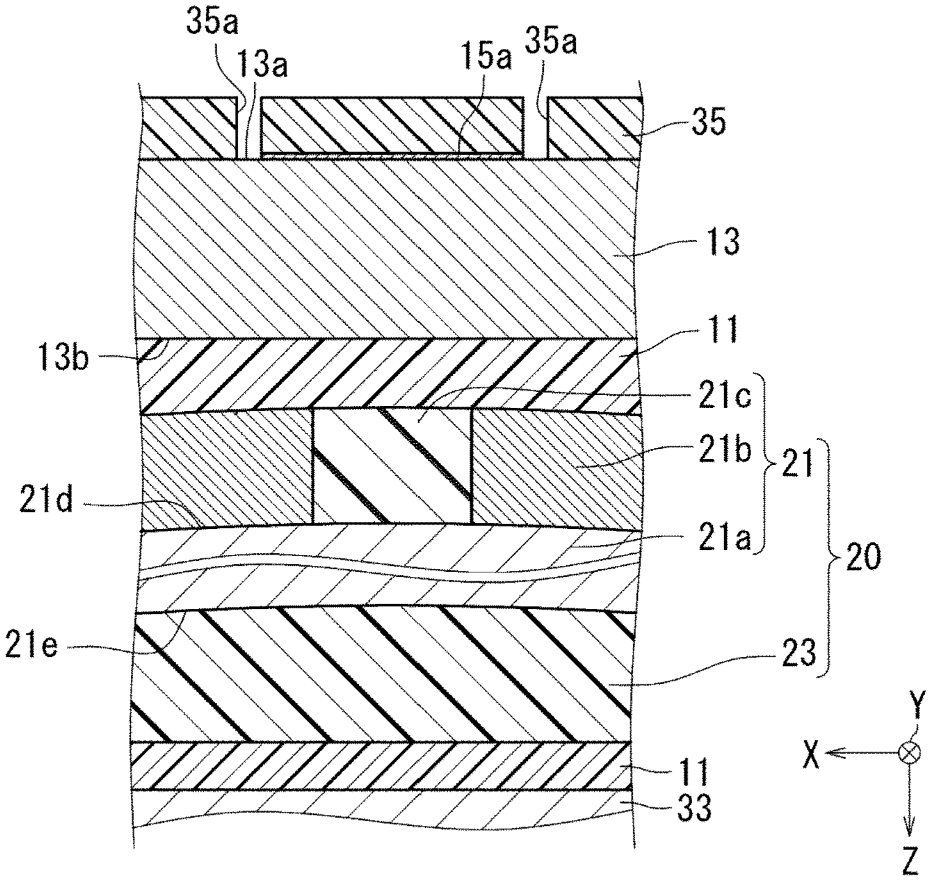
FIG. 3L is a diagram illustrating a method for manufacturing a composite component.
Figure 3M:
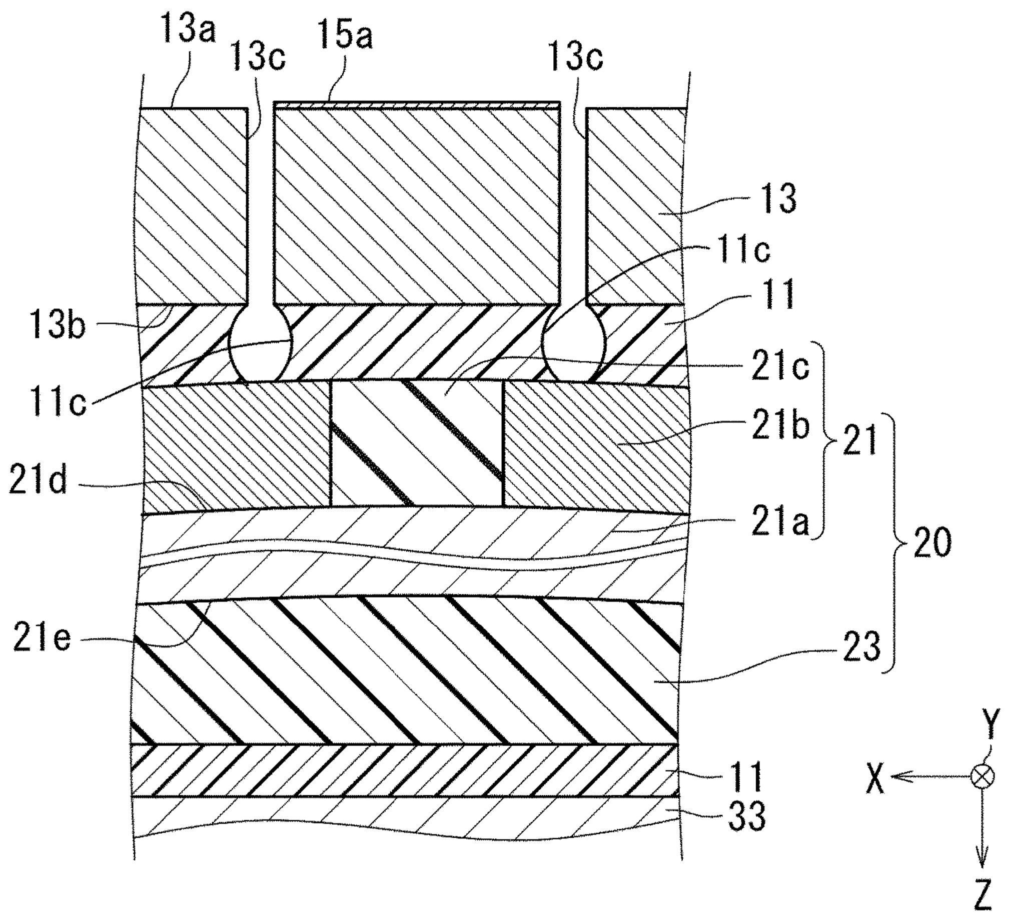
FIG. 3M is a diagram illustrating a method for manufacturing a composite component.
Figure 3N:
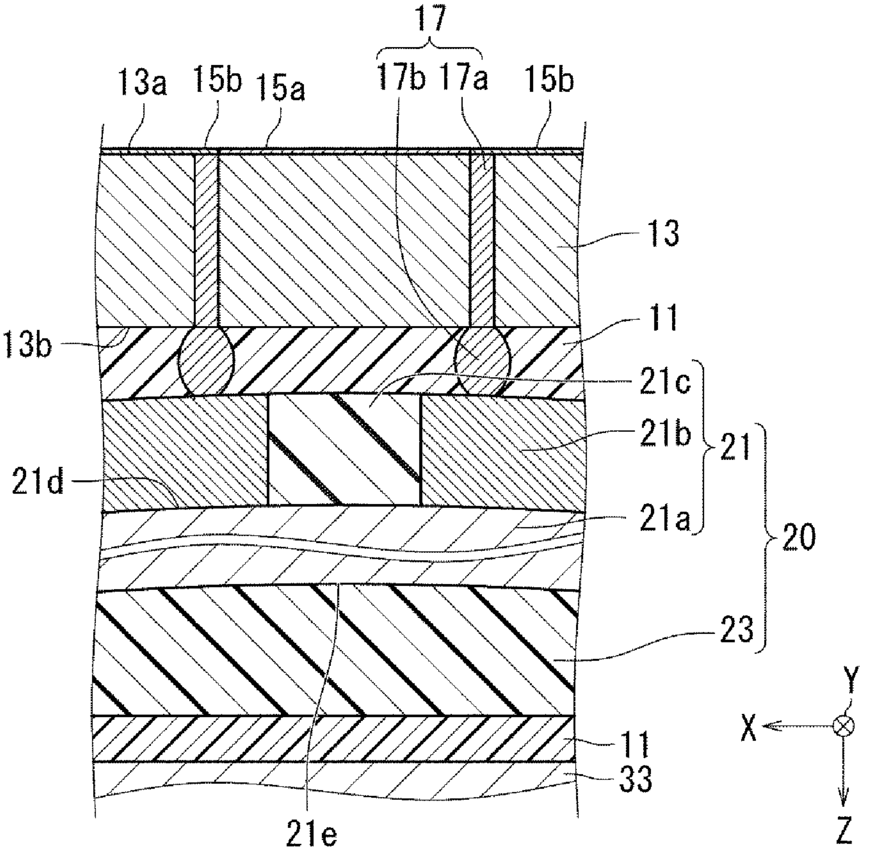
FIG. 3N is a diagram illustrating a method for manufacturing a composite component.
Figure 3O:
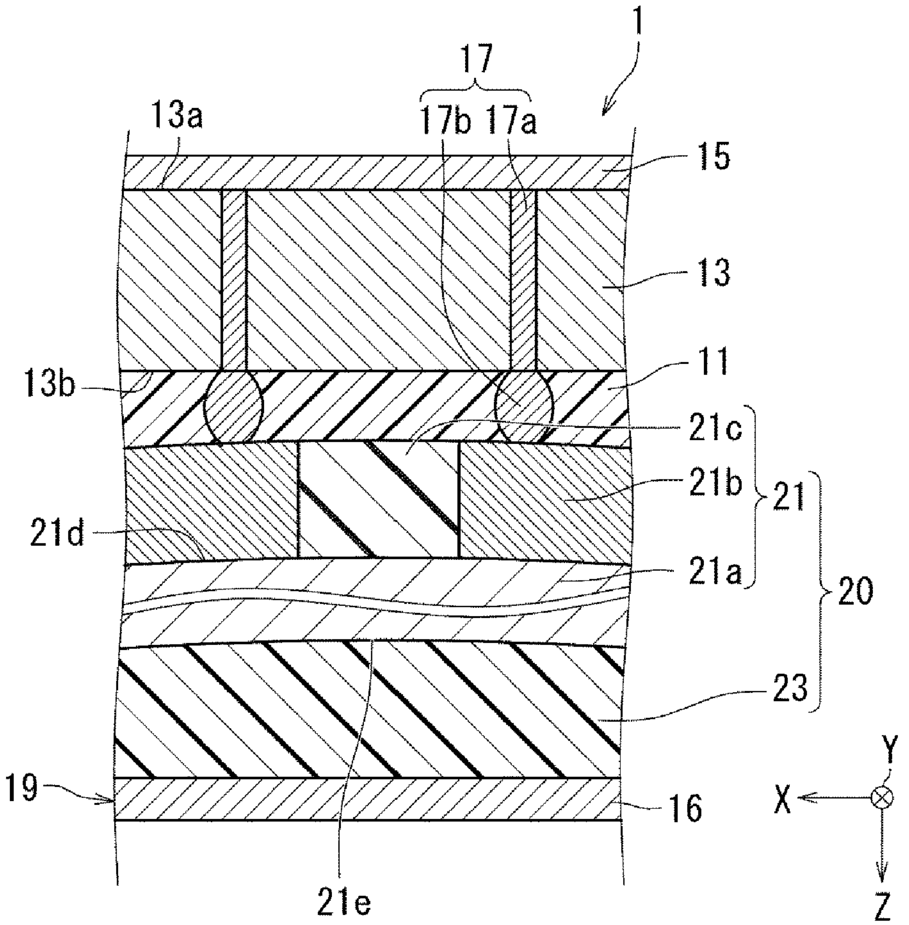
FIG. 3O is a diagram illustrating a method for manufacturing a composite component.

More specifically, with reference to FIG. 3A to FIG. 3O, an example of a method for manufacturing the composite component 1 is described. FIG. 3A to FIG. 3O are diagrams illustrating the method for manufacturing the composite component 1. The method for manufacturing the composite component 1 according to the first embodiment includes a resin layer forming process, an Si-base-layer preparing process, an electronic component bonding process, an electronic component sealing process, an electronic-component-layer thinning process, an Si-support bonding process, an Si-base-layer thinning process, a dielectric-film forming process, a through-hole forming process, a through-silicon via forming process, a rerouting-layer forming process, an interposer-electrode forming process, and a dicing process.

With this manufacturing method, a motherboard assembly including the composite components 1 integrated from the electronic component bonding process to the interposer-electrode forming process is fabricated.

(Resin Layer Forming Process)

In the resin layer forming process, a resin layer is formed between the component electrodes 21*b* of each of the electronic components 21. More specifically, in the resin layer forming process, a coating film including a resin is formed and subjected to a flattening process to form the resin layer 21*c*. As illustrated in FIG. 3A, a solution containing a resin and a solvent is applied through spin-coating to form the coating film. Here, the coating film is formed while having a lowest portion of the coating film located higher than the highest portion of the component electrodes 21*b*. Specifically, the coating film is formed to completely bury all the multiple component electrodes 21*b* in the coating film. The coating film is dried to form the resin layer 21*c*. Preferably, the resin layer 21*c* before the following flattening process completely covers the component electrodes 21*b*.

As illustrated in FIG. 3B, in the flattening process, for example, a surface planer and a grinder are used to grind and flatten the surfaces of the component electrodes 21*b* and the resin layer 21*c* to form the resin layer 21*c* between the component electrodes 21*b*. Thus, the upper surfaces of the component electrodes 21*b* are exposed, and the upper surfaces of the component electrodes 21*b* and the resin layer 21*c* are flush with each other.

(Si-Base-Layer Preparing Process)

In the Si-base-layer preparing process, an Si wafer is prepared to serve as the Si base layer 13. Although the Si wafer may have a cylindrical shape, the shape of the Si wafer is not limited to this. When the Si wafer has a cylindrical shape, the thickness of the Si wafer is, for example, 755 μm (the Si wafer diameter ø of 300 mm), 725 μm (ø of 200 mm), 625 μm (Π of 150 mm), or 525 μm (ø of 100 mm). The Si-base-layer preparing process may be performed before the resin layer forming process.

(Electronic Component Bonding Process)

In the electronic component bonding process, the adhesive layer 11 is disposed on the Si base layer 13, and the multiple electronic components 21 are bonded onto the Si base layer 13 while having the component electrodes 21*b* and the resin layer 21*c* facing the Si base layer 13 with the adhesive layer 11 interposed therebetween. In the electronic component bonding process, as illustrated in FIG. 3C, for example, an adhesive is applied to the Si base layer 13, and the multiple electronic components 21 are placed (mounted) on the Si base layer 13. Thereafter, as illustrated in FIG. 3D, the adhesive is left to cure. Thus, the adhesive layer 11 is formed while the multiple electronic components 21 are bonded onto the Si base layer 13, and the one or more electronic components 21 are curved to protrude in the mount direction.

In the electronic component bonding process, the one or more electronic components 21 have a curved shape that is curved in the mount direction. As described above, this is because the coefficient of linear expansion (for example, 40 to 150 ppm/° C.) of the resin forming the resin layers 21*c* of the one or more electronic components 21 is greater than the coefficient of linear expansion (for example, 1 to 25 ppm/° C.) of the material forming the electronic component bodies 21*a*, and thus the resin layers 21*c* expand further than the electronic component bodies 21*a* with heat (for example, 250° C.) caused while, for example, the adhesive layer 11 is formed.

In the electronic component bonding process, while the multiple electronic components 21 are placed on the adhesive coating film 31, the voids 31*c* may be formed. In addition, during curing of the adhesive coating film 31, the solvent component in the coating film 31 may evaporate to form voids. Due to these causes, normally, voids in the coating film may remain unremoved in the obtained adhesive layer, and may lower the electric connectivity.

Figure 6:
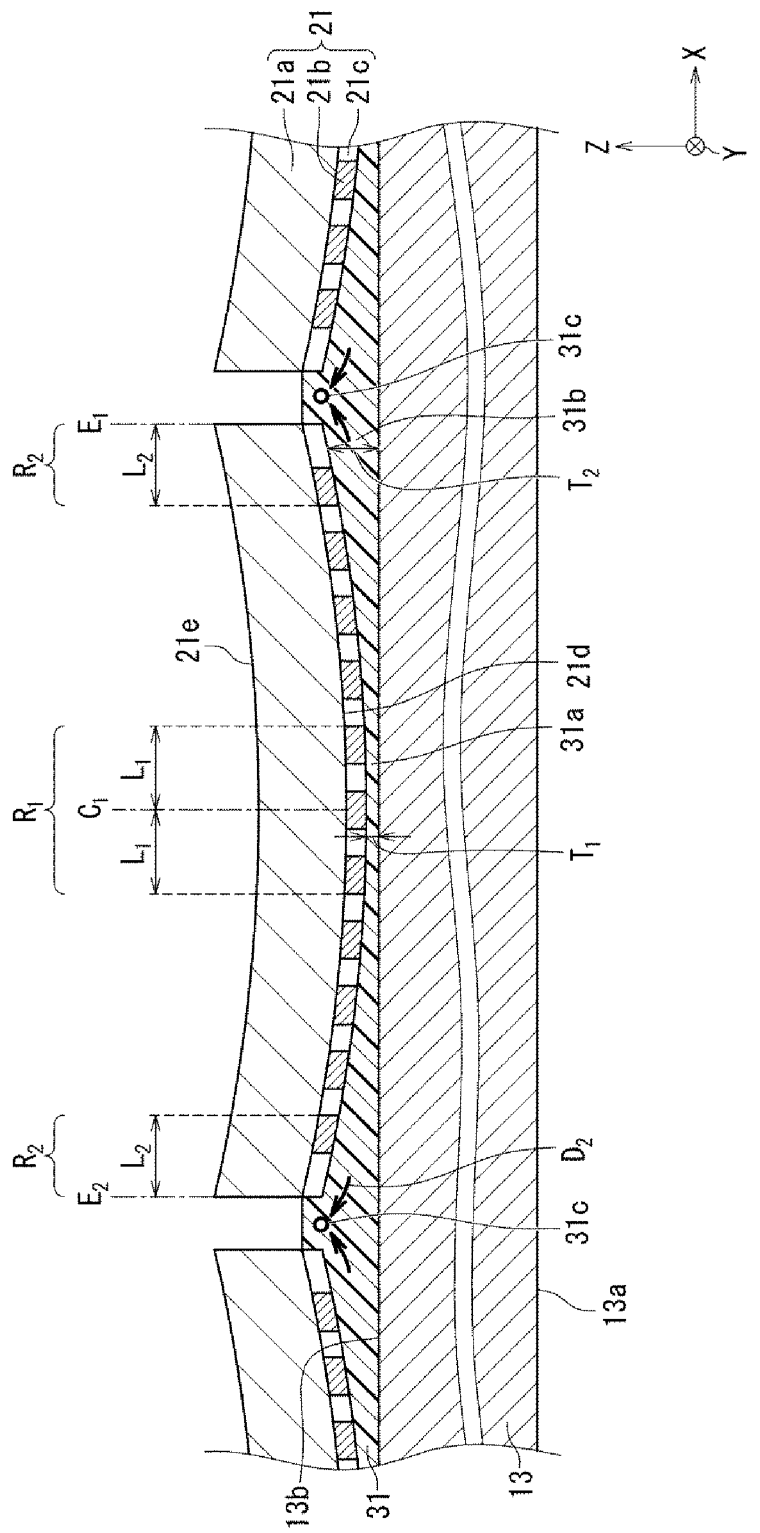
FIG. 6 is a diagram illustrating movements of voids during the manufacture of the composite component according to the first embodiment.

However, in the electronic component bonding process in the present disclosure, the one or more electronic components 21 are curved in the mount direction to reduce the voids in the adhesive layer 11. Thus, an electronic device including the composite component 1 according to the present embodiment can improve its reliability. The reason for this can be inferred as follows with reference to FIG. 6. FIG. 6 illustrates a movement of voids during the manufacture of the composite component according to the first embodiment. FIG. 6 also illustrates the state in the middle of transition from FIG. 3C to FIG. 3D. In the electronic component bonding process, when the adhesive coating film 31 starts curing, the one or more electronic components 21 are gradually curved to protrude in the mount direction. Here, the thickness of the adhesive coating film 31 at a portion corresponding to the center portion of the one or more electronic components 21 (that is, at a center portion 31*a* of the coating film 31) is made smaller than the thickness of the adhesive coating film 31 at portions corresponding to the end portions of the one or more electronic components 21 (that is, at end portions 31*b* of the coating film 31). Specifically, the cross section of the adhesive coating film 31 is smaller at the center portion 31*a* than at the end portions 31*b* of the one or more electronic components 21. Thus, the voids 31*c* formed from air trapped from the atmosphere when the one or more electronic components 21 are mounted on the adhesive coating film 31 and the voids 31*c* resulting from evaporation of the solvent in the adhesive coating film 31 with heat move from the center portion 31*a* to the end portions 31*b* of the coating film 31. The voids 31*c* that have moved to portions between the end portions of different one or more electronic components 21 move along the component electrodes 21*b* and the resin layers 21*c* of the electronic components 21 extending in the Y direction to the outside of the mount surface of the composite component 1 receiving the one or more electronic components 21. As illustrated in FIG. 6, the adhesive coating film 31 has an open system outside the mount surface receiving the one or more electronic components. The voids 31*c* that have arrived at the outside of the mount surface further move out of the coating film 31. Thus, the voids 31*c* are less likely to remain unremoved in the adhesive layer 11 in FIG. 3D. This is considered the reason why an electronic device including the composite component 1 according to the present embodiment can improve its reliability.

Herein, the center portion 31*a* of the adhesive coating film 31 indicates a portion of the coating film 31 overlapping, in the Z direction, the center portion of the one or more electronic components 21 in the composite component 1 (a range with the length $L_1$ in the X direction with respect to the middle point $C_1$ between the end surfaces $E_1$ and $E_2$ of each of the electronic components 21 in FIG. 6). The length $L_1$ is, for example, 0 to 50 μm. When the length $L_1$ is 0 μm, the center portion corresponds to the middle $C_1$. Herein, the end portions 31*b* of the adhesive coating film 31 indicate portions of the coating film 31 overlapping, in the Z direction, the end portions of the one or more electronic components 21 in the composite component 1 (a range with the length $L_2$ from the end surfaces $E_1$ and $E_2$ of each electronic component 21 in FIG. 6). When the length $L_2$ is 0 μm, the end portions correspond to the end surfaces $E_1$ and $E_2$. The length $L_2$ is, for example, 0 to 50 μm.

As illustrated in FIG. 3C, the adhesive coating film 31 is formed on the second main surface 13*b* of the Si base layer 13. Thus, a coating-film-receiving Si base layer 13 is formed. An example of the coating method is spin-coating. Preferably, the coating is preferably performed to control the thickness of the adhesive coating film 31 to fall within a range of 10 μm from the thickness of the component electrodes 21*b* of the electronic components 21. The adhesive is, for example, a thermosetting resin. An example of such a thermosetting resin is a thermosetting resin including benzocyclobutene (BCB) as a repeating unit, which can be obtained by, for example, polymerizing 1,3-divinyl-1,1,3,3-tetramethyldisiloxane-bis-benzocyclobutene (DVS-bis-BCB). A commercially available example of this adhesive is CYCLOTENE from The Dow Chemical Company.

As illustrated in FIG. 3D, the multiple electronic components 21 are placed at predetermined positions on the coating film 31 using a device including a vacuum chamber. More specifically, a wafer on which the multiple electronic components 21 are integrated (electronic-component integrated wafer) is bonded to the coating-film-receiving Si base layer 13. The electronic components 21 are pressed in both directions of the lamination direction, and heated. More specifically, the coating-film-receiving Si base layer 13 is set on a lower stage in the vacuum chamber in the device. The electronic components 21 undergo vacuum suction (or decompression suction) from the upper stage in the vacuum chamber while having the component electrodes 21*b* in the electronic components 21 facing the coating film 31. Positioning of the coating-film-receiving Si base layer 13 with respect to the electronic-component integrated wafer involves, for example, a use of a fiducial mark of the Si base layer 13. The multiple electronic components 21 are disposed on the coating-film-receiving Si base layer 13 closer to the coating film 31. The resultant is pressed in both directions in which the upper and lower stages face each other, and heated.

The electronic-component integrated wafer is bonded onto the Si base layer 13 while having the component electrodes 21*b* and the resin layer 21*c* facing the Si base layer 13 with the adhesive layer 11 interposed therebetween. The surface of the electronic-component integrated wafer that is to be bonded is defined by the component electrodes 21*b* and the resin layer 21*c*, and is flattened in the flattening process described above. When the electronic-component integrated wafer is bonded to the coating-film-receiving Si base layer 13, the coating film 31 formed on the Si base layer 13 is more likely to follow the flat surface shape of the bonded surface of the wafer. This structure thus reduces occurrence of a gap due to trapping of air as a result of the adhesive of the coating film 31 failing to fully follow the shape of the bonded surface.

(Electronic Component Sealing Process)

In the electronic component sealing process, the electronic component layer 20 is formed by sealing the multiple electronic components 21 bonded onto the Si base layer 13 with resin to form an integrated unit. More specifically, as illustrated in FIG. 3E, a dispenser is used to apply a liquid resin to the Si base layer 13 on which the electronic components 21 are mounted. Then, a compression molding machine is used to mold the applied resin. Thereafter, for example, a convection oven is used to cure the resin. Heating for curing is performed under the conditions of, for example, 150° C. for one hour. Thus, the resin seal portion 23 and the electronic component layer 20 are formed.

(Electronic-Component-Layer Thinning Process)

As illustrated in FIG. 3F, in the electronic-component-layer thinning process, for example, a backgrinder for an Si wafer is used to grind and thin the electronic component layer 20 (more specifically, the resin seal portion 23). In the electronic-component-layer thinning process, the surface of the electronic component layer 20 on which the component electrodes 21*b* of the electronic components 21 are not disposed is ground. A larger quantity of grinding is more preferable. The thickness of the thinned electronic component layer 20 is, for example, 50 to 150 μm.

In FIG. 3F illustrating an example of an electronic-component-layer thinning process, the resin seal portion 23 in the electronic component layer 20 is ground. In addition, the electronic components 21 may also be ground. However, this grinding is to be performed without damaging the internal functional portions in the electronic components 21. The functional portions are, for example, a dielectric and an electrode for a capacitor, and a wiring for an inductor.

(Si-Support Bonding Process)

As illustrated in FIG. 3G, in the Si-support bonding process, the Si support 33 is bonded to the electronic component layer 20. More specifically, the Si wafer described in the Si-base-layer preparing process is separately prepared as the Si support 33. Subsequently, with the method described in the electronic component bonding process, the adhesive coating film 31 is formed on the Si support 33. Thereafter, the electronic component layer 20 is bonded onto the Si support 33 while having its ground surface in contact with the coating film 31, pressed, and heated. Thus, the Si support 33 is formed on the ground surface of the electronic component layer 20 with the adhesive layer 11 interposed therebetween. The Si support 33 is provided to avoid, in the subsequent Si-base-layer thinning process, a harmful effect (more specifically, for example, reduction of strength) caused by the layer in the workpiece being thinner than an existing layer.

The Si support 33 can be thinned before being bonded, as needed, in view of higher workability. The Si support 33 is used to form a dielectric film with a semiconductor device in the following process. For example, when the thickness of the electronic components 21 is 150 μm, the Si wafer (0 of 300 mm, and the general thickness is 775 μm) serving as the Si support 33 is thinned to approximately 625 μm.

(Si-Base-Layer Thinning Process)

In the Si-base-layer thinning process, as illustrated in FIG. 3H, the Si base layer 13 facing the Si support 33 with the electronic component layer 20 interposed therebetween is thinned. More specifically, in the manner similar to the electronic-component thinning process, the Si base layer 13 is ground and thinned to flatten the ground surface. In the Si-base-layer thinning process, the Si base layer 13 is thinned while being supported by the Si support 33, and thus the Si base layer 13 can be effectively thinned. Thus, the method for manufacturing the composite component 1 according to the present embodiment enables manufacturing of the composite component 1 that is thinned or reduced in size and that has a desirable characteristic in its electronic component module. It is preferable to grind the largest possible quantity within the range, for example, where a predetermined level of strength is retained while the above harmful effect is avoided. In consideration of unevenness of flattening of the ground surface, the thickness of the thinned Si base layer 13 is preferably greater than or equal to 3 μm.

(Dielectric-Film Forming Process)

As illustrated in FIG. 3I, FIG. 3J, and FIG. 3K, in the dielectric-film forming process, the dielectric film 15*a* having an intended pattern is formed on the Si base layer 13. More specifically, with vapor deposition (CVD) such as plasma-enhanced chemical-vapor deposition (PECVD), the dielectric film (a thickness of 0.1 to 0.2 μm) 15*a* is formed over the entire surface of the Si base layer 13 as illustrated in FIG. 3I. The dielectric film 15*a* may include one or more layers. For example, to form the dielectric film 15*a* from four layers, in order from the side closer to the Si base layer 13, $SiO_2$ of 0.25 μm, $Si_3N_4$ of 0.1 μm, $SiO_2$ of 0.25 μm, and $Si_3N_4$ of 0.1 μm may be disposed.

In the dielectric-film forming process, before the dielectric film 15*a* is formed, the surface of the Si base layer 13 can be cleaned. Examples of cleaning include wet cleaning, and oxygen plasma ashing.

FIG. 3I to FIG. 3O illustrate components in an enlarged manner, unlike in FIG. 3A to FIG. 3H. More specifically, FIG. 3I to FIG. 3O illustrate a portion corresponding to a portion B in FIG. 3H. FIG. 3I to FIG. 3O are diagrams mainly illustrating the formation of the through-silicon vias 17 and the rerouting layer 15. Thus, for the purpose of convenience, the through-silicon vias 17, the rerouting layer 15, and the portions at which the through-silicon vias 17 and the rerouting layer 15 are formed are illustrated in an enlarged manner.

Subsequently, as illustrated in FIG. 3J, the dielectric film 15*a* is patterned through photolithography. A liquid resist is spin-coated over the entire surface of the dielectric film 15*a* to form a photoresist film 35. The photoresist film 35 is exposed to light with a mask corresponding to an intended pattern interposed therebetween. The photoresist film 35 exposed to light is developed. With reactive ion etching (RIE), the dielectric film 15*a* on the photoresist film 35 is selectively removed. For example, when the above dielectric film 15*a* including four layers is formed, two layers of the dielectric film 15*a* from the surface side (the surface of the dielectric film 15*a* opposite to the Si base layer 13) are selectively removed. Thereafter, the photoresist film 35 is removed. Thus, the dielectric film 15*a* having an intended pattern illustrated in FIG. 3K is formed on the Si base layer 13. In addition, the dielectric film 15*a* functions as an insulating film that electrically insulates the two through-silicon vias 17 illustrated in FIG. 3O described below from each other.

The first main surface 13*a* of the Si base layer 13 may also include a mark layer. An infrared (IR) camera is used to detect the mark layer to enable positioning in photolithography.

(Through-Hole Forming Process)

In the through-hole forming process, as illustrated in FIG. 3L and FIG. 3M, the through-holes 13*c* and 11*c* are formed in the Si base layer 13 and the adhesive layer 11 by etching to expose the component electrodes 21*b*. More specifically, the photoresist film 35 is formed over the entire surface. The photoresist film 35 is exposed to light with a mask corresponding to the pattern of the through-silicon vias 17 interposed therebetween. The photoresist film 35 exposed to light is developed to form the photoresist film 35 having a predetermined pattern as illustrated in FIG. 3L. As illustrated in FIG. 3M, the Si base layer 13 and the adhesive layer 11 arranged in the Z direction are selectively removed (etched) through cavities 35*a* in the photoresist film 35. Etching is performed by, for example, RIE and laser irradiation. Thus, the through-holes 13*c* and 11*c* are formed, and the component electrodes 21*b* (portions of the upper surface of the component electrodes 21*b*) are exposed. Here, the through-holes 11*c* in the adhesive layer 11 have an elliptic shape. This is because, the material forming the adhesive layer 11 is more easily etched than the material forming the Si base layer 13. Thus, the elliptic extensions 17*b* are formed in the subsequent through-silicon via forming process. After the through-holes 13*c* and 11*c* are formed, the photoresist film 35 is removed. A preferable method of etching is RIE. Using RIE as an etching method improves the flatness of the upper surfaces of the exposed component electrodes 21*b*, and thus the component electrodes 21_b_ can establish preferable connection with the through-silicon vias 17 formed later. This structure can further restrict the reduction in electric connectivity.

(Through-Silicon Via Forming Process)

As illustrated in FIG. 3N, in the through-silicon via forming process, the through-silicon vias 17 are formed in the through-holes 13_c_ and 11_c_ through electroplating. The through-silicon vias 17 are formed in the through-holes 13_c_ and 11_c_ through electroplating (more specifically, Cu electroplating) with dual damascene (more specifically, Cu dual damascene).

(Rerouting-Layer Forming Process and Interposer-Electrode Forming Process)

As illustrated in FIG. 3O, in the rerouting-layer forming process, the dielectric film 15_a_ and the wirings 15_b_ with a predetermined pattern are formed by photolithography and etching to form the rerouting layer 15. In the interposer-electrode forming process, the Si support 33 and the adhesive layer 11 that bonds the Si support 33 to the electronic component layer 20 are removed to form the interposer electrodes 19_a_. In FIG. 3O, the dielectric film 15_a_ formed in FIG. 3I to FIG. 3K and the wirings 15_b_ formed in FIG. 3N are illustrated in combination in the rerouting layer 15.

(Dicing Process)

In the dicing process, a motherboard assembly is cut into pieces with a dicing machine. Thus, the composite component 1 is manufactured.

Example

In accordance with a method for manufacturing a composite component illustrated in FIG. 3A to FIG. 3O, a composite component included within the range of the present disclosure was fabricated. More specifically, a resin layer (a coefficient of linear expansion of 60 ppm) was formed from polyimide to cover the component electrodes of the electronic components. The resin layer and the component electrodes were ground, the resin layer was flattened, and the component electrodes were exposed and flattened. Five electronic components (with a thickness of 100 μm) of this type were prepared. Thus, the five electronic components included electronic component bodies, component electrodes disposed on the electronic component bodies, and a resin layer disposed between the component electrodes. As illustrated in FIG. 2, each of the electronic components included eleven component electrodes on the third main surface of the electronic component body and the resin layer disposed between the component electrodes. The eleven component electrodes had the same width (the dimension in the X direction) and the same thickness (the dimension in the Z direction), and were equidistantly arranged on the third main surface of the electronic component body. The twelve resin layers had the same width (the dimension in the X direction) and the same thickness (the dimension in the Z direction), and were equidistantly arranged on the third main surface of the electronic component body. The material forming the electronic components was silicon (with a coefficient of linear expansion of 3 ppm). A coefficient of linear expansion of the resin layers was greater than the coefficient of linear expansion of the electronic components.

Using the adhesive ("CYCLOTENE" from The Dow Chemical Company), an adhesive coating film was formed on the prepared Si base layer 13 to bond the five electronic components onto the Si base layer 13, and was formed into the adhesive layer. The eleven electronic components were sealed with epoxy resin to form the resin seal portion. In the electronic-component-layer thinning process, the resin seal portion alone was ground without grinding the electronic components. As in the five electronic components illustrated in FIG. 1, all the eleven electronic components were arranged adjacent to each other. In addition, the eleven electronic components were arranged while having their middle points of the diagonals arranged in a direction parallel to the X direction in a plan view (in a XY plan view). The electronic component layer was thinned, the Si support 33 was bonded, the Si base layer 13 was thinned, and the through-holes were formed to form the through-silicon vias, the rerouting layer, and the interposer electrode. Thus, the composite component was obtained.

The composite component was cut along the ZX plane including the center portion of the composite component according to Example 1, and an SEM image of the cross section was captured. The first straight line that passes, in the SEM image, a first intersection point of the first end surface of one electronic component and the mount surface, and a second intersection point of the second end surface of the electronic component and the mount surface was formed. Whether any mount surface region extends vertically downward (in the negative Z direction) beyond the first straight line was checked. The other four electronic components were similarly checked for the mount surface region that extends in the negative Z direction beyond the first straight line. All the mount surfaces that extend in the negative Z direction beyond the first straight line were curved. Thus, the five first curved surfaces have been confirmed to be located on the mount surface of the composite component.

For each of the five electronic components, a third straight line that passes, in the SEM image, a fifth intersection point of the third main surface of the corresponding one of the five electronic components and the first end surface and a sixth intersection point of the third main surface and the second end surface was formed. Whether any electronic component body region extends in the negative Z direction beyond the third straight line was checked. All the surfaces of the electronic component body region that extend in the negative Z direction beyond the third straight line were curved surfaces. Thus, all the five electronic components have been confirmed to have a curved shape. Thus, the five first curved surfaces on the mount surface of the composite component have been confirmed to be adjacent to each other with four bends interposed therebetween.

A second straight line that passes, in the SEM image, a third intersection point of the first end surface of the composite component and the component surface and a fourth intersection point of the second end surface of the composite component and the component surface was formed. All the component surfaces of the composite component have been confirmed to be located in the negative Z direction from the second straight line. In addition, the component surfaces have been confirmed to be curved surfaces. Thus, the entirety of the composite component has been confirmed to be curved to protrude in the mount direction.

In the captured SEM image, all the five electronic components were included and arranged adjacent to each other. When the thickness of the Si base layer 13 was measured (number of measurements n=3), the thickness of the Si base layer 13 was 50 μm in the composite component according to Example 1. The thickness of the Si base layer 13 was smaller than the thickness (100 μm) of the plurality of electronic components. The thickness of the adhesive layer in each of the five electronic components was smaller at the center portion than at the end portions. In one of the electronic components, the thickness at the center portion was 4.0 μm, the thickness at one end portion was 4.8 μm, and the thickness at the other end portion was 5.1 μm (number of measurements n=3 at each portion). The thickness at the center portion was smaller than or equal to 10 μm.

Second Embodiment: Package Structure

With reference to FIG. 4 and FIG. 5, a package structure according to second embodiment is described. FIG. 4 is a cross-sectional view of a package structure according to a second embodiment. FIG. 5 is a diagram illustrating movements of voids during the manufacture of the package structure according to the second embodiment, and corresponds to an enlarged portion of the portion C in FIG. 4 in the manufacture of the package structure. In FIGS. 4 to 5, for ease of illustration, the through-silicon vias 17 and the interposer electrodes 19*a* are omitted.

In a package structure 100 according to the second embodiment, the composite component 1 according to the first embodiment is mounted on the circuit board 103, the interposer electrodes 19*a* of the composite component 1 and the circuit board 103 are electrically connected through solder bumps 105, and the solder bumps 105 are sealed in the underfill layer 101.

In the second embodiment, the composite component 1 is secured onto the circuit board 103 with the solder bumps 105 to be integrated with the circuit board 103 to be formed into a module. Thus, a module product such as a semiconductor package can be manufactured.

The solder bumps 105 are adjustable in their heights along the curved shape of the composite component 1 (the curved shape). Thus, regardless of when including one or more first curved surfaces that are curved to protrude in the mount direction, the composite component 1 according to the first embodiment restricts the reduction in electric connectivity.

The underfill layer 101 is filled between, and connected to the mount surface of the composite component 1 and the upper surface of the circuit board 103. The underfill layer 101 also prevents a short circuit between the solder bumps 105.

The package structure 100 according to the second embodiment includes fewer voids 101*c* in the underfill layer 101, and thus restricts the reduction in electric connectivity. The reason for this can be inferred as follows. Normally, when an underfill member is filled between the composite component and the circuit board during the manufacture of package structures, air may be trapped. Thus, the resulting underfill layer may include voids, reduce the connectability between the composite component and the circuit board, and thus reduce the electric connectivity of the package structure.

However, the package structure 100 according to the second embodiment includes the composite component 1 according to the first embodiment, and thus, the thickness of the coating film 101*a* of the underfill member (for example, epoxy resin) is smaller at the center portion of the composite component 1 than at the end portions. Thus, the coating film 101*a* of the underfill member has a variance in thickness. Thus, the voids 101*c* formed in the coating film 101*a* of the underfill member more easily move out of, for example, the mount surface region $R_3$ of the composite component 1 in the direction $D_1$ illustrated in FIG. 5, and move out of the coating film 101*a* of the underfill member. Thus, the resulting underfill layer 101 is considered to include fewer voids 101*c*, restrict the reduction in connectability between the composite component 1 and the circuit board 103, and restrict the reduction in electric connectivity of the package structure 100.

[Method for Manufacturing Package Structure]

A method for manufacturing a package structure includes a process (a solder bump forming process) of forming the solder bumps 105 on either or both of the interposer electrodes 19*a* of the composite component 1 and an electrode pad (not illustrated) of the circuit board 103, a process (a bonding process) of bonding the interposer electrodes 19*a* of the composite component 1 and the electrode pad of the circuit board 103 to each other with the electroconductive adhesive, a process (an underfill-layer forming process) of forming the underfill layer 101 between the mount surface 3 of the composite component 1 and the circuit board 103, and a process (a melt joining process) of melting the solder bumps 105 to electrically bond the interposer electrodes 19*a* of the composite component 1 and the electrode pad of the circuit board 103 to each other.

The present disclosure is not limited to the first and second embodiments, and is changeable within the range not departing from the gist of the present disclosure. The structures illustrated in the first and second embodiments are mere examples, and the present disclosure is not particularly limited to these embodiments. The present disclosure may be changed in various manners within the scope not substantially departing from the effects of the present disclosure.

In the embodiment, the electronic component layer 20 includes five of the five electronic components 21, but this is not the only possible example. For example, the electronic component layer 20 may include one to four of the five electronic components 21.

In the above embodiments, the electronic component layer 20 includes five of the five electronic components 21, and these electronic components 21 belong to the same type of electronic component, but this is not the only possible example. For example, at least one of the one or more electronic components 21 may belong to a different type of electronic component.

In the above embodiment, the composite component 1 has the interposer structure 10 including the interposer electrodes 19*a*, but this is not the only possible example. For example, as illustrated in FIG. 7, the composite component 1 may have a structure other than the interposer structure including the interposer electrodes 19*a*. FIG. 7 is an enlarged cross-sectional view of a composite component according to a modification example obtained by modifying the first embodiment, and corresponds to the portion in FIG. 2 illustrating the composite component 1 according to the first embodiment.

In the above embodiment, the electronic component layer 20 includes five electronic components 21 incorporated in the interposer structure 10. A different electronic component may be laminated on the electronic component layer 20. In this case, the different electronic component can be electrically connected to the interposer electrodes 19*a*. The different electronic component may belong to the same type as the incorporated electronic components, or may belong to a different type.

In the above embodiments, two through-silicon vias 17 are electrically connected to one component electrode 21*b*, but this is not the only possible example. For example, one to three or more through-silicon vias 17 may be electrically connected to one component electrode 21*b*. Among these options, preferably, two or more through-silicon vias 17 are electrically connected to one component electrode 21*b*.

When the two or more through-silicon vias 17 are electrically connected to one component electrode 21*b*, the parasitic impedance between the rerouting layer 15 and the multiple electronic components 21 is further reduced, and an electronic device including the interposer improves electric characteristics.

What is claimed is:

1. A composite component, comprising:

an Si base layer that has a first main surface and a second main surface that are opposite to each other, a rerouting layer that is on the first main surface, a through-silicon via that is electrically connected to the rerouting layer, and that extends through the Si base layer, and an electronic component layer that is on the second main surface of the Si base layer, and that includes a plurality of electronic components each including an electronic component body and a component electrode on the electronic component body, wherein the component electrode is connected to the through-silicon via, one or more of the plurality of electronic components have a curved shape that is curved to protrude in a mount direction in a cross-sectional view, and a mount surface of the composite component corresponds to the curved shape in a cross-sectional view, and includes one or more first curved surfaces that are curved to protrude in the mount direction, the plurality of electronic components are bonded to the second main surface of the Si base layer with an adhesive layer, and in a cross-sectional view, a region of the adhesive layer located between the one or more electronic components and the second main surface of the Si base layer has a smaller thickness at a center portion than at an end portion.

2. The composite component according to claim 1, comprising:

an interposer structure including the Si base layer, the rerouting layer, the through-silicon via, and an interposer electrode that faces the second main surface, wherein the electronic component layer is between the interposer electrode and the Si base layer.

3. The composite component according to claim 1, wherein in a cross-sectional view, the center portion has a thickness smaller than or equal to 10 μm.

4. The composite component according to claim 1, wherein the one or more electronic components further include a resin layer between the component electrodes.

5. The composite component according to claim 4, wherein a coefficient of linear expansion of the resin layer is greater than a coefficient of linear expansion of the electronic component body.

6. The composite component according to claim 4, wherein the resin layer includes resin, and the electronic component body includes ceramic or a semiconducting material.

7. The composite component according to claim 1, wherein the Si base layer has a thickness smaller than a thickness of the plurality of electronic components.

8. The composite component according to claim 1, wherein the electronic component layer further includes a resin seal portion that seals the plurality of electronic components, and an entirety of the composite component is curved to protrude in the mount direction.

9. The composite component according to claim 1, wherein the mount surface of the composite component includes the first curved surfaces in a cross-sectional view.

10. The composite component according to claim 9, wherein in a cross-sectional view, at least two of the first curved surfaces are adjacent to each other with a bend interposed therebetween.

11. The composite component according to claim 1, wherein the one or more first curved surfaces in the mount surface of the composite component make up equal to or more than 70% of a total area of the mount surface in a plan view.

12. The composite component according to claim 1, wherein the plurality of electronic components are in the electronic component layer while the component electrodes are electrically connected to the rerouting layer with the through-silicon via linearly extending in a cross-sectional view interposed therebetween.

13. The composite component according to claim 2, wherein the plurality of electronic components are bonded to the second main surface of the Si base layer with an adhesive layer, in a cross-sectional view, a region of the adhesive layer located between the one or more electronic components and the second main surface of the Si base layer has a smaller thickness at a center portion than at an end portion.

14. The composite component according to claim 2, wherein the one or more electronic components further include a resin layer between the component electrodes.

15. The composite component according to claim 5, wherein the resin layer includes resin, and the electronic component body includes ceramic or a semiconducting material.

16. The composite component according to claim 2, wherein the Si base layer has a thickness smaller than a thickness of the plurality of electronic components.

17. The composite component according to claim 2, wherein the electronic component layer further includes a resin seal portion that seals the plurality of electronic components, and an entirety of the composite component is curved to protrude in the mount direction.

18. The composite component according to claim 2, wherein the mount surface of the composite component includes the first curved surfaces in a cross-sectional view.

19. The composite component according to claim 2, wherein the one or more first curved surfaces in the mount surface of the composite component make up equal to or more than 70% of a total area of the mount surface in a plan view.

20. A composite component, comprising:

an Si base layer that has a first main surface and a second main surface that are opposite to each other, a rerouting layer that is on the first main surface, a through-silicon via that is electrically connected to the rerouting layer, and that extends through the Si base layer, and an electronic component layer that is on the second main surface of the Si base layer, and that includes a plurality of electronic components each including an electronic component body and a component electrode on the electronic component body, wherein the component electrode is connected to the through-silicon via, one or more of the plurality of electronic components have a curved shape that is curved to protrude in a mount direction in a cross-sectional view, and a mount surface of the composite component corresponds to the curved shape in a cross-sectional view, and includes one or more first curved surfaces that are curved to protrude in the mount direction, the one or more electronic components further include a resin layer between the component electrodes, and a coefficient of linear expansion of the resin layer is greater than a coefficient of linear expansion of the electronic component body.

21. A composite component, comprising:

an Si base layer that has a first main surface and a second main surface that are opposite to each other, a rerouting layer that is on the first main surface, a through-silicon via that is electrically connected to the rerouting layer, and that extends through the Si base layer, and an electronic component layer that is on the second main surface of the Si base layer, and that includes a plurality of electronic components each including an electronic component body and a component electrode on the electronic component body, wherein the component electrode is connected to the through-silicon via, one or more of the plurality of electronic components have a curved shape that is curved to protrude in a mount direction in a cross-sectional view, and a mount surface of the composite component corresponds to the curved shape in a cross-sectional view, and includes one or more first curved surfaces that are curved to protrude in the mount direction, and the one or more first curved surfaces in the mount surface of the composite component make up equal to or more than 70% of a total area of the mount surface in a plan view.

* * * * *